(12) United States Patent
Dubey

(10) Patent No.: US 7,368,948 B2
(45) Date of Patent: May 6, 2008

(54) INTEGRATED RECEIVER CIRCUIT

(75) Inventor: Hari Dubey, München (DE)

(73) Assignee: Infineon Technologies AG, Neubiberg (DE)

( * ) Notice: Subject to any disclaimer, the term of this patent is extended or adjusted under 35 U.S.C. 154(b) by 222 days.

(21) Appl. No.: 11/182,064

(22) Filed: Jul. 15, 2005

(65) Prior Publication Data

US 2007/0013410 A1    Jan. 18, 2007

(51) Int. Cl.
*H03K 19/0175* (2006.01)

(52) U.S. Cl. ............................ 326/81; 326/68; 327/108

(58) Field of Classification Search ................ 327/108, 327/112, 306, 309; 330/253; 326/30, 36, 326/38, 81
See application file for complete search history.

(56) References Cited

U.S. PATENT DOCUMENTS

| | | | | |
|---|---|---|---|---|
| 5,592,063 A | * | 1/1997 | Savignac et al. ........... | 320/166 |
| 5,886,578 A | * | 3/1999 | Miyashita et al. .......... | 330/253 |
| 6,285,256 B1 | * | 9/2001 | Wong ......................... | 330/255 |
| 6,806,734 B2 | * | 10/2004 | Cairns et al. ................. | 326/68 |
| 7,034,572 B2 | * | 4/2006 | Kim et al. .................... | 326/68 |
| 2004/0174191 A1 | | 9/2004 | Radelinow | |

* cited by examiner

*Primary Examiner*—James Cho
*Assistant Examiner*—Crystal L Hammond
(74) *Attorney, Agent, or Firm*—Edell, Shapiro & Finnan, LLC

(57) ABSTRACT

An integrated receiver circuit for amplifying an input signal based on a reference signal includes two voltage converters to respectively convert the input and reference signals to level-converted input and reference signals. An amplifier stage includes a PMOS input differential amplifier driven by the converted input and reference signals, and an NMOS input differential amplifier driven by the input and reference signals. The amplifier stage is connected to a first control stage to compensate an output offset current generated by the amplifier stage. A second control stage is cascaded to the first control stage to provide a duty cycle correction of an output signal. The receiver circuit ensures amplification of an input signal even if a level of the reference signal is close to a supply voltage, the input and reference signals have a large variation range, or the input signal has an asymmetrical input swing about the reference signal.

37 Claims, 14 Drawing Sheets

INTEGRATED RECEIVER CIRCUIT

FIELD OF THE INVENTION

The present invention relates to an integrated receiver circuit, and more particularly to an integrated receiver circuit which is used as an input receiver circuit in a semiconductor memory device.

BACKGROUND

In semiconductor memory devices, receiver circuits are used as an interface between a processor and other components of the semiconductor memory device. Such receiver circuits receive input signals, such as input data signals, and generate output signals, which are processed by further circuit components inside the semiconductor memory device. In most cases the receiver circuits are designed as differential receiver circuits that convert data from a low swing NRZ (non return to zero) voltage to full swing CMOS-levels. As the operating frequencies of processors increase from generation to generation, along with increases in processor bandwidth and the corresponding bandwidth of the data provided to the interface receiver circuit, interface circuits need to adapt to these changed operating conditions.

An issue in the design of input receiver circuits is to provide the output signal of the receiver circuit as a low-jitter signal to meet set-up and hold time requirements for a high-speed sampling process performed by flip-flops. For an input receiver circuit using a single-ended reception of data, one terminal of the input receiver circuit is actuated by an input signal which is to be amplified, and the other terminal is actuated by a reference signal. FIG. 1 shows an input receiver circuit designed as a differential amplifier stage 50 comprising a differential amplifier circuit 50a and a differential amplifier circuit 50b. The differential amplifier circuit 50a is designed as a PMOS input differential amplifier circuit, whereas circuit 50b is designed as an NMOS input differential amplifier circuit.

The PMOS input differential amplifier circuit 50a includes a PMOS transistor 51a, another PMOS transistor 52a, an NMOS transistor 53a, another NMOS transistor 54a, and a current source 55a. The PMOS transistor 51a is connected at its gate to an input terminal E51a for applying an input signal, at its source to the current source 55a, and at its drain to the drain of the NMOS transistor 53a. The NMOS transistor 53a is connected at its drain to the drain of the PMOS transistor 51a, and at its source to a reference voltage VSS. The NMOS transistor 54a is connected at its gate to the gate of the NMOS transistor 53a, at its drain to the gate of the NMOS transistor 53a and the drain of the PMOS transistor 52a, and at its source to the reference voltage VSS. The current source 55a is connected at one of its terminals to a power supply voltage VDD and at its other terminal to the source of the PMOS transistor 51a and the source of the PMOS transistor 52a. It is controlled by a control signal BIASP. An output terminal A50a of the PMOS input differential amplifier circuit 50a is connected to a junction between the drain of the PMOS transistor 51a and the drain of the NMOS transistor 53a and outputs an output signal of the PMOS input differential amplifier circuit 50a.

The NMOS input differential amplifier circuit 50b includes an NMOS transistor 51b, another NMOS transistor 52b, a PMOS transistor 53b, another PMOS transistor 54b, and a current source 55b. The PMOS transistor 53b is connected at its source to a power supply voltage VDD, and at its drain to the drain of the NMOS transistor 51b. The PMOS transistor 54b is connected at its source to the power supply voltage VDD, and at its drain to the gate of the PMOS transistor 53b and the drain of the NMOS transistor 52b. The NMOS transistor 51b is connected at its gate to an input terminal E51b for applying an input signal IN, at its drain to the drain of the PMOS transistor 53b, and at its source to the current source 55b. The NMOS transistor 52b is connected at its gate to a reference terminal E52b for applying a reference signal REF, at its drain to the drain of the PMOS transistor 54b, and at its source to the current source 55b. The current source 55b is connected at one of its terminals to a reference voltage VSS and at its other terminal to the source of the NMOS transistor 51b and the source of the NMOS transistor 52b. It is controlled by a control signal BIASN. An output terminal A50b of the NMOS input differential amplifier circuit 50b is connected to a junction between the drain of the PMOS transistor 53b and the drain of the NMOS transistor 51b and outputs an output signal of the NMOS differential circuit 50b.

FIG. 1 shows two differential amplifiers in a parallel configuration. The PMOS input differential amplifier preferably operates for amplifying an input signal IN which is below a level of the reference signal REF. The NMOS input differential amplifier preferably operates for amplifying an input signal, wherein a level of the input signal is above a level of the reference signal REF.

FIG. 2 shows two input signals IN1 and IN2 symmetrically oscillating around a level of a reference signal REF1 or REF2. The level of the reference signal varies between reference level REF1 and REF2, wherein the input signal swing is coupled to the variation of the reference signal. The level of the reference signal REF1 is lower than the level of the reference signal REF2. This variation occurs in a system having a high variation of the power supply voltage from a transmitting device, or if transmitting and receiving devices have different potentials.

FIG. 3 shows an asymmetrical waveform of an input signal IN oscillating around different levels of a reference signal REF. The input signal swing oscillates around a constant level. The reference signal REF varies between a low level REFMIN and a high level REFMAX. Such a level variation of the reference signal occurs especially when the reference signal REF is very noisy due to coupling from neighboring transitioning signals, or when the reference signal is generated by noisy power supplies.

The architecture of the receiver circuit shown in FIG. 1 works correctly only for a supply voltage considerably higher than the reference voltage REF. However, reductions in supply voltages in the latest technologies render this voltage comparable to the reference voltage and hence give rise to variations of the level of the reference signal. Variations in the voltage level of the reference signal increase the signal skew in the system and hence decrease the set-up and hold margin for the data if a sampling clock is having a differential input swing.

Variations in the level of the reference signal as shown in FIGS. 2 and 3 will turn off the PMOS input differential amplifier 50a resulting in signal skew (jitter) and duty cycle distortion. If PMOS input differential amplifier circuit 50a and NMOS input differential amplifier circuit 50b are designed for a low level of a reference signal REF, they produce a duty cycle error such that a low level of an amplified output signal OS is generated with a longer duration than a high level of the amplified output signal, even if the high and low levels of the input signal IN have the same duration. Conversely, if PMOS input differential amplifier circuit 50a and NMOS input differential amplifier circuit 50*b* are designed for a high level of a reference signal REF, they produce a duty cycle error such that a high level of an amplified output signal OS is generated with a longer duration than a low level of the amplified output signal, even if the high and low levels of the input signal IN have the same duration.

FIG. 4 shows another conventional circuit design. The differential amplifier stage 50 is identical to the circuit stage illustrated in FIG. 1. FIG. 4 additionally contains a control stage 60. The amplifier stage 50 provides amplification, and the control stage 60 reduces an offset current generated by the amplifier stage 50. The offset current may be caused by a transistor mismatch within amplifier stage 50. The control stage 60 comprises a resistor-connected inverter followed by another inverter 64. The resistor-connected inverter comprises a PMOS transistor 61 which is coupled between a power supply voltage VDD and an input E64 of the inverter 64. An NMOS transistor 62 is coupled between a reference voltage VSS and the input E64 of the inverter 64. The control terminals E61 of transistor 61 and E62 of transistor 62 are connected to the output A50 of the differential amplifier stage 50. The resistor 63 is coupled between the output terminal A50 of the amplifier stage 50 and the input E64 of the inverter 64. The control stage 60 generates at an output terminal A60 an output signal OUT with an offset current reduced in comparison to the offset current generated by the amplifier stage 50.

Similar to the control stage 60 of FIG. 4, U.S. Patent Publication No. US 2004/174191 discloses an offset-reducing block cascaded with a differential pre-amplifier and arranged for reducing the offset generated by the differential pre-amplifier, and a buffering block in series with the offset-reducing block and arranged for amplifying and buffering the output voltage of the offset-reducing block.

However, the circuit design shown in FIG. 4 will also provide duty cycle distortion for the output signal OUT if the supply voltage VDD is comparable to the reference voltage REF, as the PMOS input differential amplifier circuit 50*a* is turned to an off-state.

SUMMARY

According to one aspect of the invention, an integrated receiver circuit amplifies an input signal with great reliability, the integrated circuit being operable with a low supply voltage. The integrated receiver circuit can accomplish this amplification of the input signal with the input signal symmetrically oscillating around a reference signal, wherein both the input and reference signals have a large variation range. In accordance with another aspect of the invention, the integrated receiver circuit can amplify an input signal with great reliability, with the input signal asymmetrically oscillating around the reference signal, wherein the reference signal has a large variation range.

In the following, an integrated receiver circuit is specified which is preferably used when the input signal symmetrically oscillates around a level of a reference signal, wherein the input signal and the reference signal have a large variation range. The integrated receiver circuit comprises a first terminal for applying an input signal and a second terminal for applying a reference signal, wherein the input signal oscillates around the reference signal. The integrated receiver circuit comprises a first voltage converter including a first input terminal for applying the input signal and an output terminal for generating a first converted input signal, wherein the first voltage converter comprises a source follower circuit designed to provide the first converted input signal at its output terminal with a level that is lower than a level of the input signal. The integrated receiver circuit includes a second voltage converter including a first input terminal for applying the reference signal and an output terminal for generating a first converted reference signal, wherein the second voltage converter comprises a source follower circuit designed to provide the first converted reference signal at its output terminal with a level that is lower than a level of the reference signal. The integrated receiver circuit comprises an amplifier stage including an output terminal for outputting an amplified signal, wherein the amplified signal has a level depending on a level of the input signal with reference to the reference signal. The amplifier stage comprises a first differential amplifier circuit including a first input terminal for applying the first converted input signal and a second input terminal for applying the first converted reference signal, wherein the amplifier stage comprises a second differential amplifier circuit including a first input terminal for applying the input signal and a second input terminal for applying the reference signal.

According to a further embodiment of the integrated receiver circuit, the first voltage converter comprises a second input terminal for applying the reference signal. The first voltage converter comprises a first transistor with a control terminal and a second transistor with a control terminal, wherein the first transistor is coupled between a supply voltage and the output terminal of the first voltage converter, and the second transistor is coupled between the output terminal of the first voltage converter and a reference voltage. The first input terminal of the first voltage converter is connected to the control terminal of the first transistor of the first voltage converter. The second input terminal of the first voltage converter is connected to the control terminal of the second transistor of the first voltage converter.

In a further embodiment of the integrated receiver circuit, the second voltage converter comprises a second input terminal for applying the reference signal. The second voltage converter comprises a first transistor with a control terminal and a second transistor with a control terminal, wherein the first transistor is coupled between a supply voltage and the output terminal of the second voltage converter and the second transistor is coupled between the output terminal of the second voltage converter and a reference voltage. The first input terminal of the second voltage converter is connected to the control terminal of the first transistor of the second voltage converter. The second input terminal of the second voltage converter is connected to the control terminal of the second transistor of the second voltage converter.

In a preferred embodiment of the integrated receiver circuit, each of the first and second transistors of the first and second voltage converters is designed as an n-type transistor, which can be a field-effect transistor with an n-channel.

According to another embodiment of the integrated receiver circuit, the first differential amplifier circuit comprises a first p-type transistor including a control terminal and a second p-type transistor including a control terminal. The output terminal of the first voltage converter is connected to the control terminal of the first p-type transistor of the first differential amplifier circuit. The output terminal of the second voltage converter is connected to the control terminal of the second p-type transistor of the first differential amplifier circuit.

In a variant embodiment of the integrated receiver circuit, the second differential amplifier circuit comprises a first n-type transistor with a control terminal and a second n-type transistor with a control terminal. The control terminal of the first n-type transistor of the second differential amplifier circuit is driven with the input signal. The control terminal of the second n-type transistor of the second differential amplifier circuit is driven with the reference signal.

According to another embodiment of the integrated receiver circuit, the first differential amplifier circuit includes an output terminal connected to the output terminal of the amplifier stage. The second differential amplifier circuit includes an output terminal connected to the output terminal of the amplifier stage.

In a further embodiment, the integrated receiver circuit comprises a first control stage comprising an output terminal, a first transistor with a control terminal, a second transistor with a control terminal, and a resistor. The first transistor is coupled between a supply voltage and the output terminal of the first control stage, wherein the control terminal of the first transistor is connected to the output terminal of the amplifier stage. The second transistor is coupled between the output terminal of the first control stage, wherein the control terminal of the second transistor is connected to the output terminal of the amplifier stage. The resistor is coupled between the output terminal of the amplifier stage and the output terminal of the first control stage.

In another embodiment, the integrated receiver circuit includes a second control stage comprising an output terminal, a first transistor with a control terminal, a second transistor with a control terminal, and a third transistor with a control terminal, wherein the first transistor of the second control stage is coupled between the third transistor of the second control stage and the output terminal of the second control stage, and wherein the control terminal of the first transistor is connected to the output terminal of the first control stage. The second transistor of the second control stage is coupled between the output terminal of the second control stage and a reference voltage, wherein the control terminal of the second transistor is connected to the output terminal of the first control stage. The third transistor of the second control stage is coupled between a supply voltage and the first transistor of the second control stage, wherein the control terminal of the third transistor is actuated by the first converted reference signal.

According to a preferred embodiment of the integrated receiver circuit, each of the first transistor and the third transistor of the second control stage is designed as a p-type transistor, which can be a field effect transistor with a p-channel. The second transistor of the second control stage is designed as an n-type transistor, which can be a field effect transistor with a n-channel.

In a further embodiment of the integrated receiver circuit, a second control stage comprises an output terminal, a first transistor with a control terminal, a second transistor with a control terminal, and a third transistor with a control terminal. The first transistor of the second control stage is coupled between a supply voltage and the output terminal of the second control stage, wherein the control terminal of the first transistor is connected to the output terminal of the first control stage. The second transistor of the second control stage is coupled between the output terminal of the second control stage and the third transistor, wherein the control terminal of the second transistor is connected to the output terminal of the first control stage. The third transistor of the second control stage is coupled between a reference voltage and the second transistor of the second control stage, wherein the control terminal of the third transistor is actuated by the reference signal.

In a preferred embodiment of the integrated circuit, the first transistor of the second control stage is designed as a p-type transistor. Each of the second transistor and the third transistor of the second control stage is designed as an n-type transistor.

In a further embodiment of an integrated receiver circuit, the integrated receiver circuit comprises a first terminal for applying an input signal and a second terminal for applying a reference signal, wherein the input signal oscillates around the reference signal. The integrated receiver circuit comprises a first voltage converter including a first input terminal for applying the input signal and an output terminal for generating a first converted input signal. The first voltage converter comprises a source follower circuit designed to provide at its output terminal the first converted input signal with a level that is lower than a level of the input signal. Furthermore, the integrated receiver circuit comprises a second voltage converter including a first input terminal for applying the reference signal and an output terminal for generating a first converted reference signal, wherein the second voltage converter comprises a source follower circuit designed to provide at its output terminal the first converted reference signal with a level that is lower than a level of the reference signal. The integrated receiver circuit comprises a third voltage converter including a first input terminal for applying the first converted input signal and an output terminal for generating a second converted input signal, wherein the third voltage converter comprises a source follower circuit designed to provide at its output terminal the second converted input signal with a level that is higher than a level of the input signal. The integrated receiver circuit comprises a fourth voltage converter including a first input terminal for applying the first converted reference signal and an output terminal for generating a second converted reference signal, wherein the fourth voltage converter comprises a source follower circuit designed to provide at its output terminal the second converted reference signal with a level that is higher than a level of the input signal. The integrated receiver circuit comprises an amplifier stage including an output terminal for outputting an amplified signal, wherein the amplified signal includes a level depending on a level of the input signal with reference to the reference signal, wherein the amplifier stage comprises a first differential amplifier circuit including a first input terminal for applying the first converted input signal and a second input terminal for applying the first converted reference signal, wherein the amplifier stage comprises a second differential amplifier circuit including a first input terminal for applying the second converted input signal and a second input terminal for applying the second converted reference signal.

According to a further embodiment of the integrated receiver circuit, the third voltage converter comprises a second input terminal for applying the first converted reference signal. The third voltage converter comprises a first transistor with a control terminal and a second transistor with a control terminal, wherein the first transistor is coupled between a reference voltage and the output terminal of the third voltage converter, and the second transistor is coupled between the output terminal of the third voltage converter and a supply voltage. The first input terminal of the third voltage converter is connected to the control terminal of the first transistor of the third voltage converter. The second input terminal of the third voltage converter is connected to the control terminal of the second transistor of the third voltage converter.

According to a further embodiment of the integrated circuit, the fourth voltage converter comprises a second input terminal for applying the first converted reference signal. The fourth voltage converter comprises a first transistor with a control terminal and a second transistor with a control terminal, wherein the first transistor of the fourth voltage converter is coupled between a supply voltage and the output terminal of the fourth voltage converter, and the second transistor is coupled between the output terminal of the fourth voltage converter and a reference voltage. The first input terminal of the fourth voltage converter is connected to the control terminal of the first transistor of the fourth voltage converter. The second input terminal of the fourth voltage converter is connected to the control terminal of the second transistor of the fourth voltage converter.

In a preferred embodiment of the integrated receiver circuit, each of the first and second transistors of the third and fourth voltage converters is designed as a p-type transistor.

In the following, an integrated receiver circuit is specified which is preferably used when the input signal asymmetrically oscillates around a level of a reference signal, wherein the reference signal has a large variation range. The integrated receiver circuit comprises an input terminal for applying an input signal and a reference terminal for applying a reference signal, wherein the input signal oscillates around the reference signal, wherein a high level of the input signal is above a level of the reference signal, and a low level of the input signal is below the level of the reference signal. The integrated receiver circuit comprises a voltage converter stage including an output terminal comprising a first voltage converter and a second voltage converter. The first voltage converter includes a first input terminal for applying the reference signal and an output terminal. The first voltage converter is designed such that it provides at its output terminal a first converted reference signal with a level that is lower than a level of the reference signal. The second voltage converter includes a first input terminal for applying the first converted reference signal. The second voltage converter is designed such that it provides a second converted reference signal at the output terminal of the voltage converter stage, wherein the level of the second converted reference signal is between the high and the low level of the input signal. The integrated receiver circuit comprises a differential amplifier circuit including a first input terminal for applying the input signal and a second input terminal for applying the second converted reference signal, and including an output terminal for outputting an amplified signal, wherein the amplified signal has a level depending on a level of the input signal with reference to the second converted reference signal.

According to another embodiment of the integrated receiver circuit, the first voltage converter includes a second input terminal for applying the reference signal. The first voltage converter comprises a first transistor and a second transistor, wherein the first transistor of the first voltage converter is coupled between a supply voltage and the output terminal of the first voltage converter, and the second transistor of the first voltage converter is coupled between the output terminal of the first voltage converter and a reference voltage. The second voltage converter comprises a first transistor and a second transistor, wherein the first transistor of the second voltage converter is coupled between a supply voltage and the output terminal of the voltage converter stage, and the second transistor of the second voltage converter is coupled between the output terminal of the voltage converter stage and a reference voltage. Each of the first and second transistors of the second voltage converter is actuated by the first converted reference signal.

According to another embodiment of the integrated receiver circuit, each of the first and second transistors of the first voltage converter is designed as an n-type transistor. Each of the first and second transistors of the second voltage converter is designed as a p-type transistor.

In the following, an integrated receiver circuit is specified which comprises a first input receiver circuit and a second input receiver circuit. The first input receiver circuit comprises an integrated receiver circuit, as described above, which is preferably designed to amplify an input signal symmetrically oscillating around a level of a reference signal, wherein the input signal and the reference signal have a large variation range. The second input receiver circuit is an integrated receiver circuit, as described above, which is preferably designed to amplify an input signal asymmetrically oscillating around a level of a reference signal, wherein the reference signal has a large variation range. The first input receiver circuit has a first input terminal for applying an input signal, a second input terminal for applying a reference signal, and an output terminal for outputting an amplified signal in dependence on a level of the input signal with reference to the reference signal. The second input receiver circuit includes a first input terminal for applying an input signal, a second input terminal for applying a reference signal, and an output terminal for outputting an amplified signal in dependence on a level of the input signal with reference to the reference signal. The integrated receiver circuit comprises an output terminal for outputting an amplified signal. The integrated receiver circuit comprises a select circuit comprising a control terminal for applying a select signal and an output terminal. The output terminal of the first input receiver circuit is connected to the output terminal of the select circuit when the select signal has a first level, and the output terminal of the second input receiver circuit is connected to the output terminal of the select circuit when the select signal has a second level.

BRIEF DESCRIPTION OF THE DRAWINGS

The invention is explained in more detail below with reference to the figures illustrating exemplary embodiments of the invention.

DETAILED DESCRIPTION OF THE INVENTION

Figure 5:
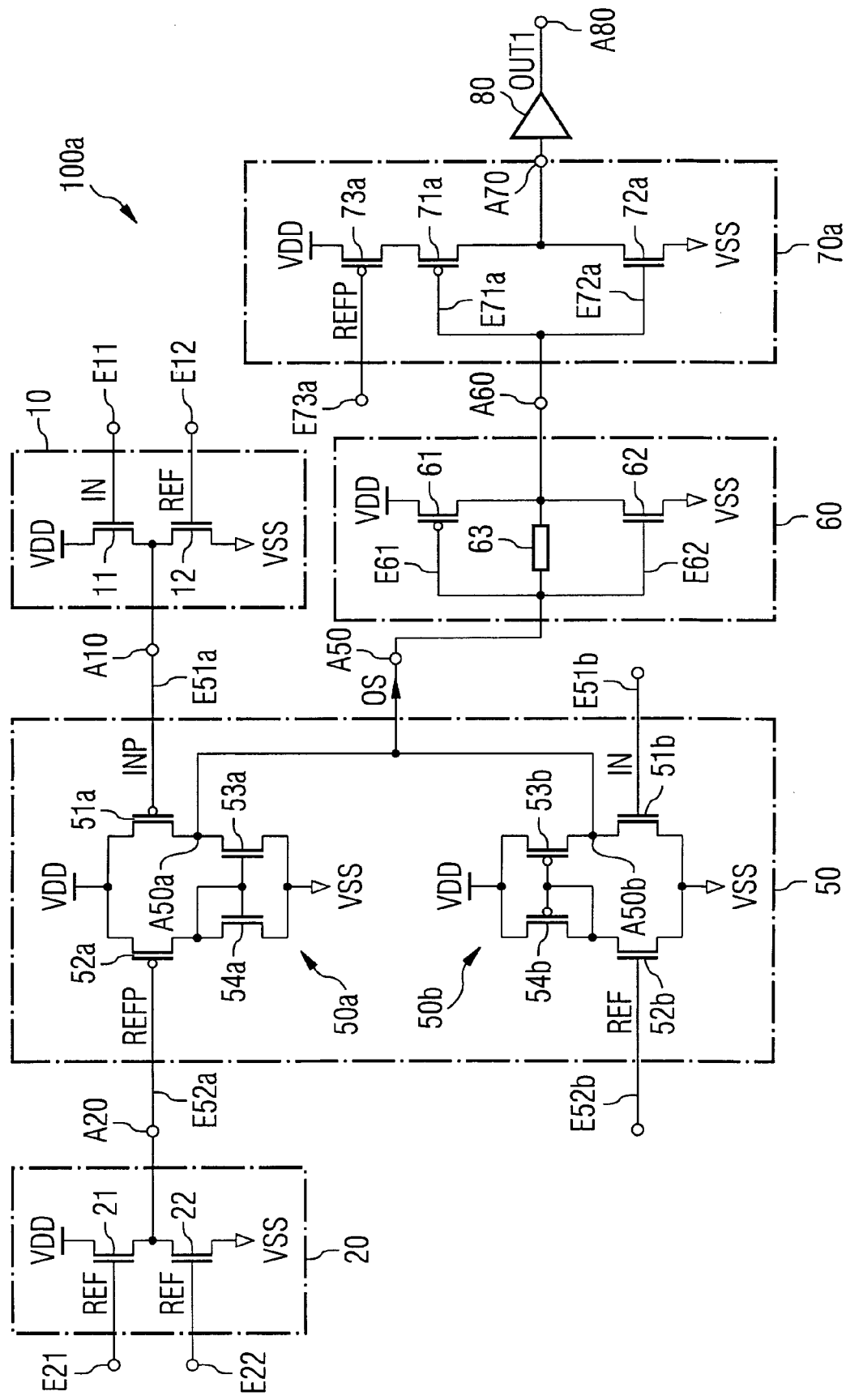
FIG. 5 shows a first embodiment of an integrated receiver circuit according to the present invention.

FIG. 5 shows a first embodiment of an integrated circuit for amplifying an input signal according to the present invention. The integrated circuit comprises a voltage converter 10, a voltage converter 20, an amplifier stage 50, a control circuit 60 and a control circuit 70a.

The voltage converter 10 is designed as a source follower. It comprises a transistor 11 and a transistor 12 which are connected in series between a supply voltage VDD and a reference voltage VSS. A control terminal of the transistor 11 is connected to an input terminal E11 for applying an input signal IN. A control terminal of the transistor 12 is connected to an input terminal E12 for applying a reference signal REF. Transistor 12 operates as a biasing transistor. The voltage converter 10 converts a level of the input signal IN to a level of a converted input signal INP at an output terminal A10. Source follower 10 is designed such that the voltage level of the converted input signal INP is lower than the voltage level of the input signal IN.

Voltage converter 20 is also designed as a source follower circuit comprising a transistor 21 and a transistor 22 which are connected in series between power supply voltage VDD and reference voltage VSS. A control terminal of the transistor 21 is connected to an input terminal E21 for applying a reference signal REF. A control terminal of the transistor 22 is connected to an input terminal E22 for applying the reference signal REF. Transistor 22 operates as a biasing transistor. Similar to the function of voltage converter 10, voltage converter 20 converts a level of reference signal REF at the input terminal E21 to a converted reference signal REFP at an output terminal A20 of the voltage converter 20.

All transistors of voltage converters 10 and 20 are n-type transistors.

Figure 1:
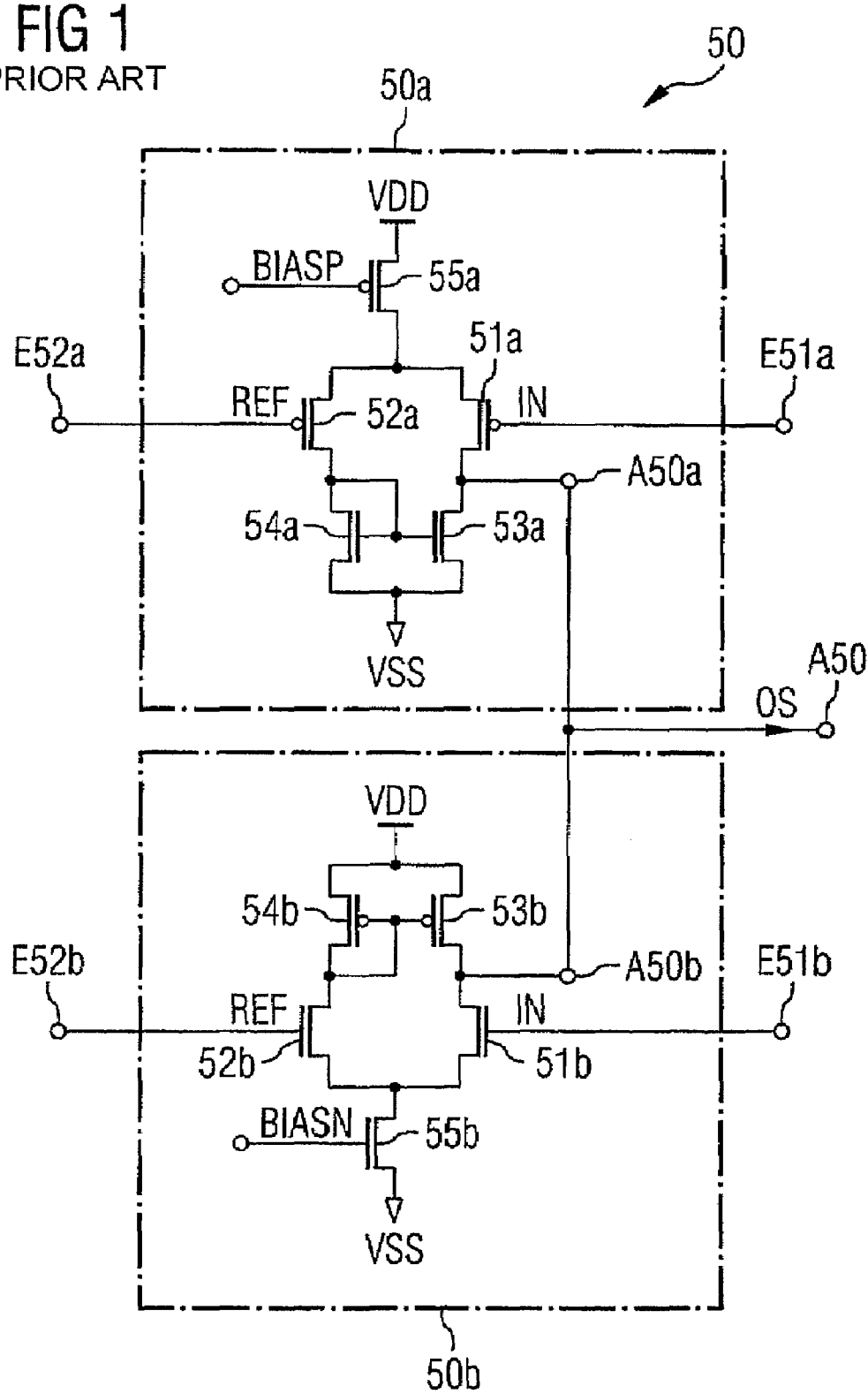
FIG. 1 shows an integrated receiver circuit according to a conventional design.

Amplifier stage 50 is designed as described in detail according to FIG. 1. It is designed as a complementary amplifier stage comprising a PMOS input differential amplifier 50a and an NMOS input differential amplifier 50b. A control terminal E51a of a PMOS transistor 51a is connected to the output terminal A10 of voltage converter 10. A control terminal E52a of a PMOS transistor 52a is connected to the output terminal A20 of voltage converter 20. Voltage converter 10 is designed in such a way that it provides the converted input signal INP at the output terminal A10 with a level such that PMOS transistor 51a is operated in the saturation region. Voltage converter 20 is designed in such a way that it provides converted reference signal REFP at the output terminal A20 with a level such that transistor 52a is operated in a saturation region. By operating transistor 51a and transistor 52a in the saturation region, it is ensured that the PMOS input differential amplifier 50a provides an amplified output signal at an output terminal A50 of amplifier stage 50 with sufficient amplification.

Figure 2:
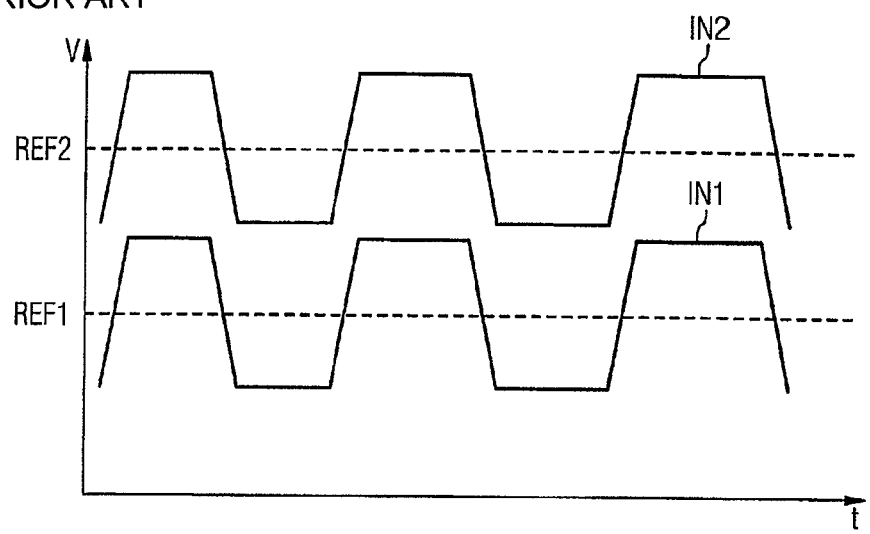
FIG. 2 shows an input signal symmetrically oscillating around a reference signal, both signals having a large variation range.

While PMOS input differential amplifier 50a is driven by a level-converted input and a level-converted reference signal, NMOS input differential amplifier 50b is directly driven by input signal IN and reference signal REF. Input signal IN drives a control terminal E51b of the NMOS transistor 51b, and the reference signal REF drives a control terminal E52b of the NMOS transistor 52b. Due to the variation range of input signal IN and reference signal REF, as shown in FIG. 2, it is preferred to provide both NMOS transistors 51b and 52b with a thick oxide gate for better reliability.

If PMOS input differential amplifier 50a and NMOS input differential amplifier 50b are sized well, they compensate for any offset variation. However, due to tolerances of the components of PMOS input differential amplifier 50a and NMOS input differential amplifier 50b, in particular due to transistor mismatch, output offset currents will occur at the output terminal A50. In order to compensate the offset provided by the amplifier stage 50, a control stage 60 is connected to the output terminal A50 of the amplifier stage 50. Control stage 60 is designed as a resistor-connected inverter as described according to FIG. 4.

A control stage 70a is connected to the output terminal A60 of control stage 60. Control stage 70a is designed to provide a duty cycle correction if the input signal symmetrically oscillates around a high level of the reference signal, as shown in FIG. 2 for input signal IN2 and reference signal REF2. Control stage 70a comprises a PMOS transistor 71a, an NMOS transistor 72a and a PMOS transistor 73a. PMOS transistor 71a and PMOS transistor 73a are connected in series between a power supply voltage VDD and an output terminal A70 of control stage 70a. NMOS transistor 72a is coupled between output terminal A70 of control stage 70a and a reference voltage VSS. Output terminal A70 is connected to output terminal A80 by a following amplifier 80 to generate an output signal OUT1. Control terminals E71a and E72a of transistors 71a and 72a are connected to the output terminal A60 of control stage 60. Control terminal E73a of PMOS transistor 73a is driven by the converted reference signal REFP which is generated by voltage converter 20.

As described above, the amplifier stage 50 provides an amplified output signal OS at output terminal A50 with a duty cycle error. If differential amplifier circuits 50a and 50b are designed for a low level of the reference signal REF, as shown in FIG. 2 for reference signal REF1, amplifier stage 50 provides a low level of the amplified output signal OS for a longer duration than a high level. Control stage 70a according to FIG. 5 enables a duty cycle correction if such an amplifier is driven with a high reference voltage level, as shown for reference voltage REF2 in FIG. 2. Since voltage converter 20 generates the converted reference signal REFP with a high level if it is driven with a high level of the reference signal REF, PMOS transistor 73a, too, is driven with that high level of converted reference signal REFP, which in turn makes this transistor weaker. The resistance of PMOS transistor 73a increases and, hence, compensation for a high duration for a low logic level is provided at the output terminal A70. Therefore, output signal OUT1 does not show any duty cycle error.

Figure 6:
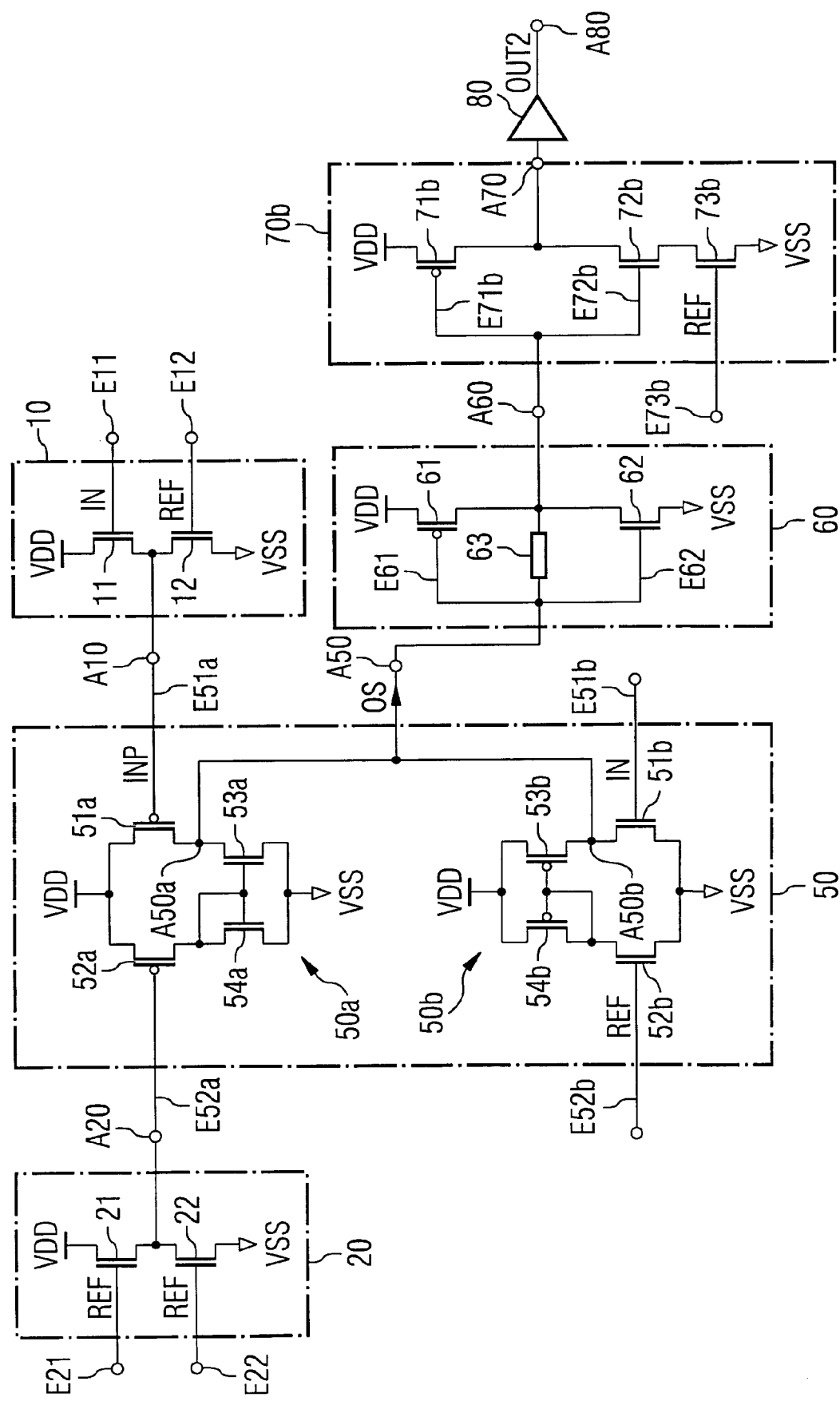
FIG. 6 shows a second embodiment of an integrated receiver circuit according to the present invention.

FIG. 6 shows a second embodiment of an integrated receiver circuit for amplifying an input signal according to the present invention. The integrated receiver circuit comprises the voltage converter 10, the voltage converter 20, the amplifier stage 50, and the control circuit 60 as already described according to FIG. 5. However, the integrated receiver circuit comprises a control stage 70b which differs from the design of control stage 70a of FIG. 5. Control stage 70b comprises a PMOS transistor 71b which is coupled between a supply voltage VDD and an output terminal A70 of control stage 70b. Furthermore, it comprises an NMOS transistor 72b and an NMOS transistor 73b which are connected in series between the output terminal A70 of control stage 70b and a reference voltage VSS. Control terminal E71b of PMOS transistor 71b and control terminal E72b of NMOS transistor 72b are connected to output terminal A60 of control stage 60. Control terminal E73b of NMOS transistor 73b is driven by the reference signal REF.

If PMOS input differential amplifier 50a and NMOS input differential amplifier 50b are designed for a high level of reference voltage REF, as illustrated in FIG. 2 for reference signal REF2, it is preferred to design control stage 70b as illustrated in FIG. 6. In this case, without providing control stage 70b, amplifier stage 50 provides a duty cycle error, wherein it generates the high level of the amplified output signal OS for a higher duration as the low level. Control stage 70b compensates the high duration for the high level of the amplified output signal and generates at the output terminal A70, respectively at output terminal A80 behind amplifier 80, an output signal OUT2 with nearly the same duration for its high and low levels.

Figure 7:
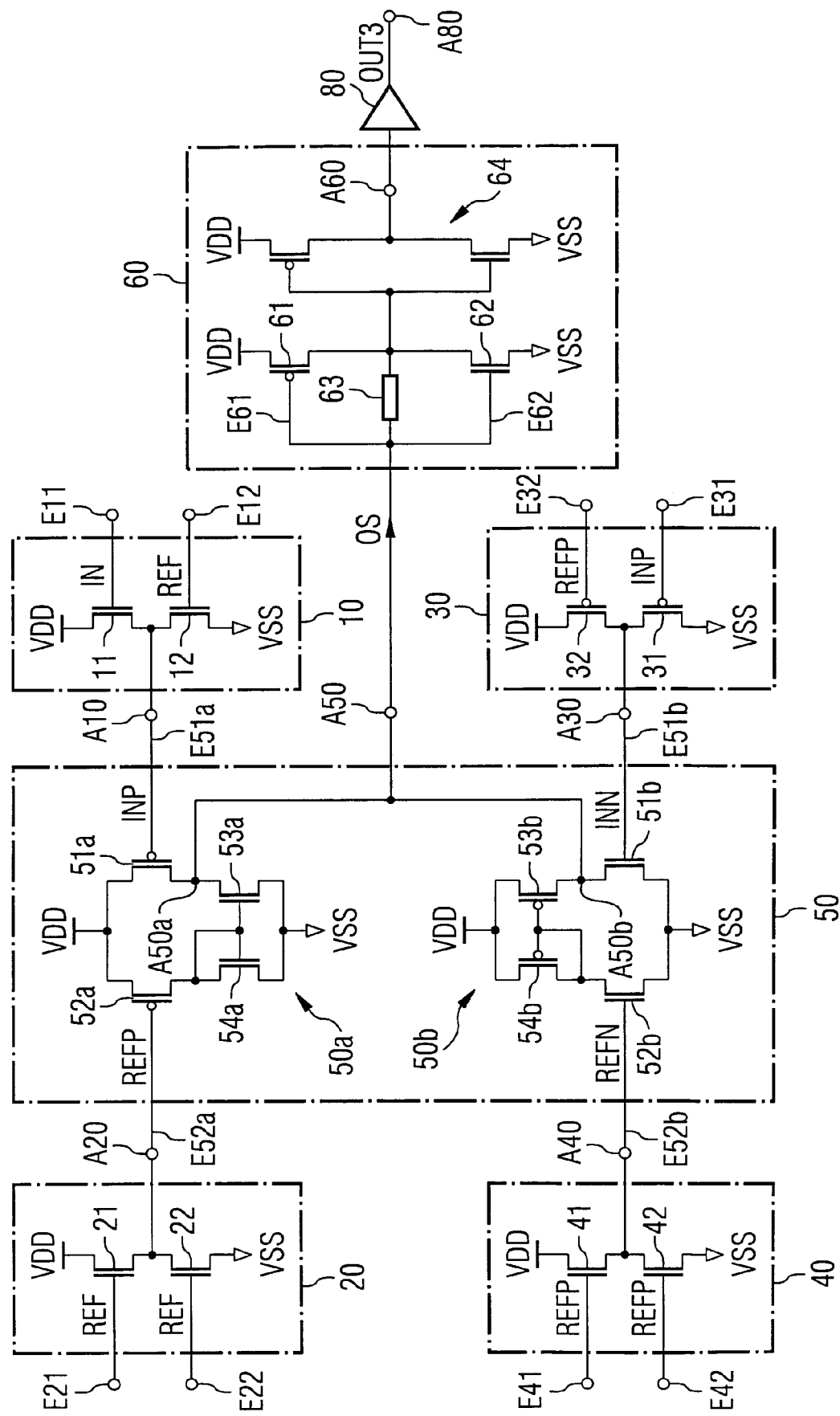
FIG. 7 shows a third embodiment of an integrated receiver circuit according to the present invention.

FIG. 7 shows a third embodiment of an integrated receiver circuit. The voltage converter 10, the voltage converter 20 and the amplifier stage 50 are designed in the same way as illustrated in FIGS. 5 and 6. Control stage 60 is connected to the output terminal A50 of amplifier stage 50. Control stage 60 comprises the resistor-connected inverter comprising PMOS transistor 61, NMOS transistor 62 and resistor 63, as already described in FIGS. 4, 5 and 6. It additionally comprises an inverter 64 which is coupled between a supply voltage VDD and a reference voltage VSS. An output terminal A60 of control stage 60 is connected to an output terminal A80 by means of amplifier 80 to generate amplified output signal OUT3.

In contrast to FIGS. 5 and 6, the integrated circuit according to FIG. 7 does not contain a control stage 70a or 70b for a duty cycle correction. Instead of using a control stage for duty cycle correction, in the circuit design of FIG. 7, NMOS input differential amplifier 50b is driven by a converted input signal INN and a converted reference signal REFN.

Converted input signal INN is generated by a voltage converter 30 which is designed as a source follower. Voltage converter 30 comprises a PMOS transistor 31 and a PMOS transistor 32. PMOS transistor 31 is coupled between an output terminal A30 of voltage converter 30 and a reference voltage VSS. PMOS transistor 32 is coupled between output terminal A30 and a supply voltage VDD. A control terminal E31 of PMOS transistor 31 is driven by converted input signal INP generated by voltage converter 10, whereas a control terminal E32 of PMOS transistor 32 is driven by converted reference signal REFP generated by voltage converter 20. Converted input signal INN drives control terminal E51b of NMOS transistor 51b.

Converted reference signal REFN is generated by a voltage converter 40 designed as a source follower which comprises a PMOS transistor 41 and a PMOS transistor 42. PMOS transistor 41 is coupled between a supply voltage VDD and an output terminal A40 of voltage converter 40. PMOS transistor 42 is coupled between the output terminal A40 and a reference voltage VSS. A control terminal E41 of PMOS transistor 41 is driven by converted reference signal REFP generated by voltage converter 20. In the same way, control terminal E42 of PMOS transistor 42 is driven by the converted reference signal REFP provided by voltage converter 20.

Voltage converter 30 converts input signal INP provided by voltage converter 10 to converted input signal INN. Voltage converter 30 is designed in such a way that converted input signal INN has a higher level than converted input signal INP at control terminal E31. In the same way, voltage converter 40 is designed in such a way that it generates converted reference signal REFN at output terminal A40 with a higher level than the level of converted reference signal REFP at control terminal E41. However, voltage converter 30 and voltage converter 40 generate converted input signal INN and converted reference signal REFN with a level which is lower than the level of the supply voltage VDD.

By using voltage converters 10, 20, 30 and 40, it is ensured that PMOS input differential amplifier 50a and NMOS input differential amplifier 50b are driven by input and reference signals which are lower than the current level of the supply voltage VDD. Therefore, in the design according to FIG. 7, transistors 51a, 52a, 51b and 52b are provided with a thin oxide gate. Since the levels of the reference signals provided to the amplifier stage 50 are always lower than the level of the supply voltage VDD, transistors 51a, 52a, 53b and 54b will be operated in the saturation region and hence provide an amplified output signal OS at output terminal A50, even if the reference signal REF has a level in the range of the level of the supply voltage VDD. However, it is optional to also provide a control stage for duty cycle correction, such as shown in FIGS. 5 and 6. If the reference signal REFP, which drives PMOS transistor 41, PMOS transistor 42 and PMOS transistor 32, has a level in the range of the supply voltage VDD, a higher supply voltage has to be used, for example an external supply voltage which is pumped by a pump circuit or a supply voltage usually used by I/O circuits.

Figure 8:
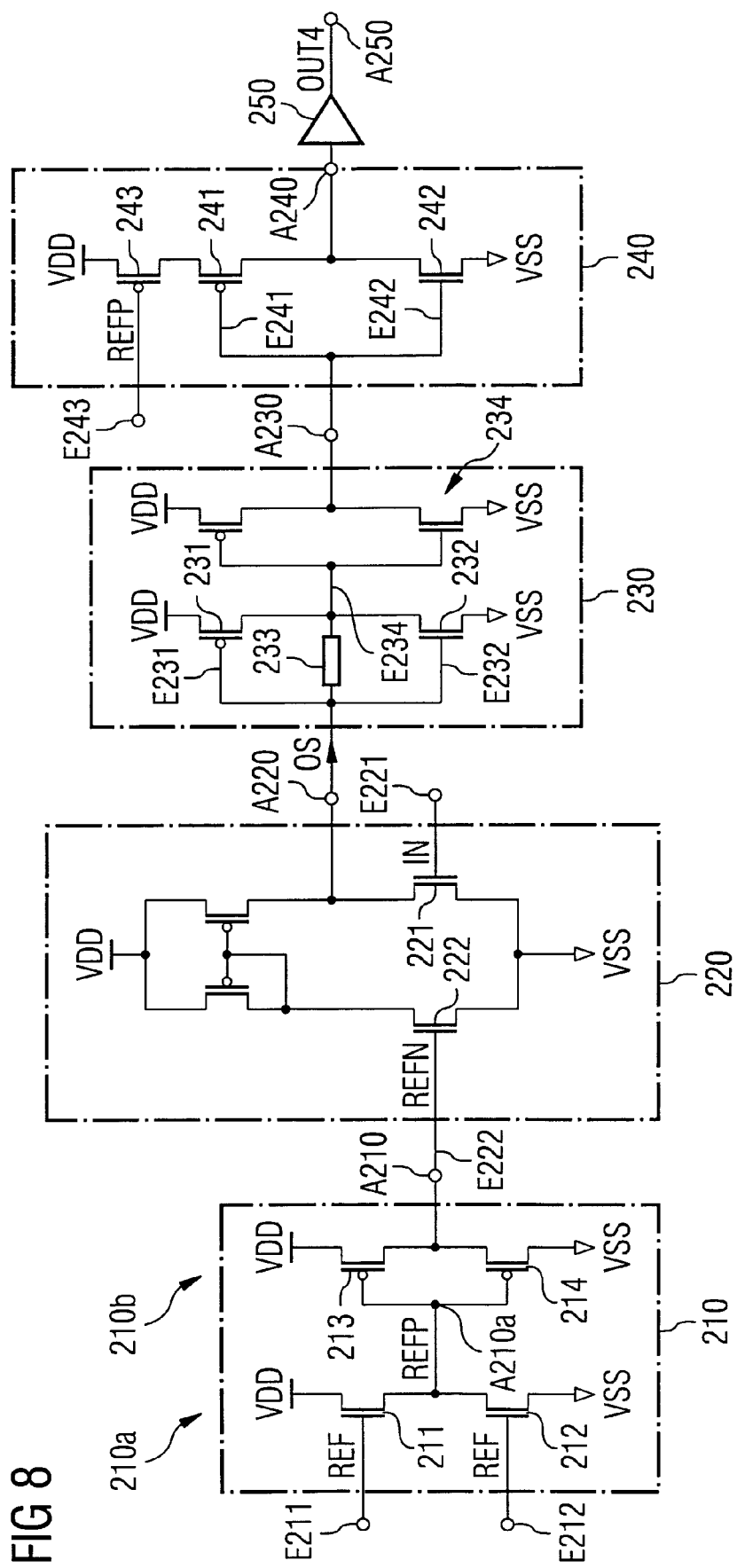
FIG. 8 shows a fourth embodiment of an integrated receiver circuit according to the present invention.

FIG. 8 shows a fourth embodiment of an integrated receiver circuit. The integrated circuit comprises a voltage converter 210, an amplifier stage 220, a control stage 230 and a control stage 240. Voltage converter stage 210 comprises a voltage converter circuit 210a and a voltage converter circuit 210b. Voltage converter circuit 210a includes an NMOS transistor 211 and an NMOS transistor 212 which are coupled between a supply voltage VDD and a reference voltage VSS. A control terminal E211 of NMOS transistor 211 is driven by the reference signal REF. In the same way, a control terminal E212 of NMOS transistor 212 is driven by the reference signal REF. First voltage converter circuit 210a generates at an output terminal A210a a converted reference signal REFP, which is driven to control terminals of PMOS transistor 213 and PMOS transistor 214 of voltage converter circuit 210b. PMOS transistor 213 is coupled between a supply voltage VDD and an output terminal A210 of voltage converter stage 210. PMOS transistor 214 is coupled between the output terminal A210 of voltage converter stage 210 and a reference voltage VSS. If the reference signal REFP, which drives PMOS transistor 213 has a level in the range of the supply voltage VDD, a higher supply voltage has to be used, for example an external supply voltage which is pumped by a pump circuit or a supply voltage usually used by I/O circuits. Voltage converter stage 210 ensures that the converted reference voltage REFN at output terminal A210 does not vary much with a large variation of the level of the reference signal REF.

Amplifier stage 220 is designed as an NMOS input differential amplifier. It comprises an NMOS transistor 221 which is driven at its control terminal E221 by input signal IN and an NMOS transistor 222 which is driven at its control terminal E222 by converted reference signal REFN.

Output terminal A220 of amplifier stage 220 is connected to control stage 230, which has the same design as control stage 60 of FIG. 7. An output terminal A230 of control stage 230 is connected to control stage 240, which has the same design as control stage 70a of FIG. 5. An output terminal A240 is connected via an inverter 250 to an output terminal A250 for generating an amplified output signal OUT4.

Voltage converter stage 210 is designed such that it provides the converted reference signal REFN at output terminal A210 with a level which is almost exactly in the middle between the high and low levels of the input signal IN, irrespective of any variation in the reference signal REF at control terminals E211 and E212. By providing the voltage converter stage 210, it is ensured that amplifier stage 220 is driven by an input signal IN which oscillates symmetrically around the converted reference signal REFN, whereas input signal IN oscillates asymmetrically around reference signal REF. Control stage 230 offers less susceptibility to any offset generated by amplifier stage 220. Control stage 240 compensates for any duty cycle error for low levels of the reference signal REF.

If input terminal E222 were directly driven by a reference signal REF with a low level, NMOS input differential amplifier circuit 222 would not be strong enough to compensate for any asymmetry of the input signal swing and would hence provide a low skew signal with respect to any reference voltage variation. The integrated receiver circuit presented in FIG. 8 prevents that, for any asymmetry of the input swing of the input signal IN, an output signal OUT4 has a longer duration for a high logic input level than for a low logic input level.

Figure 9:
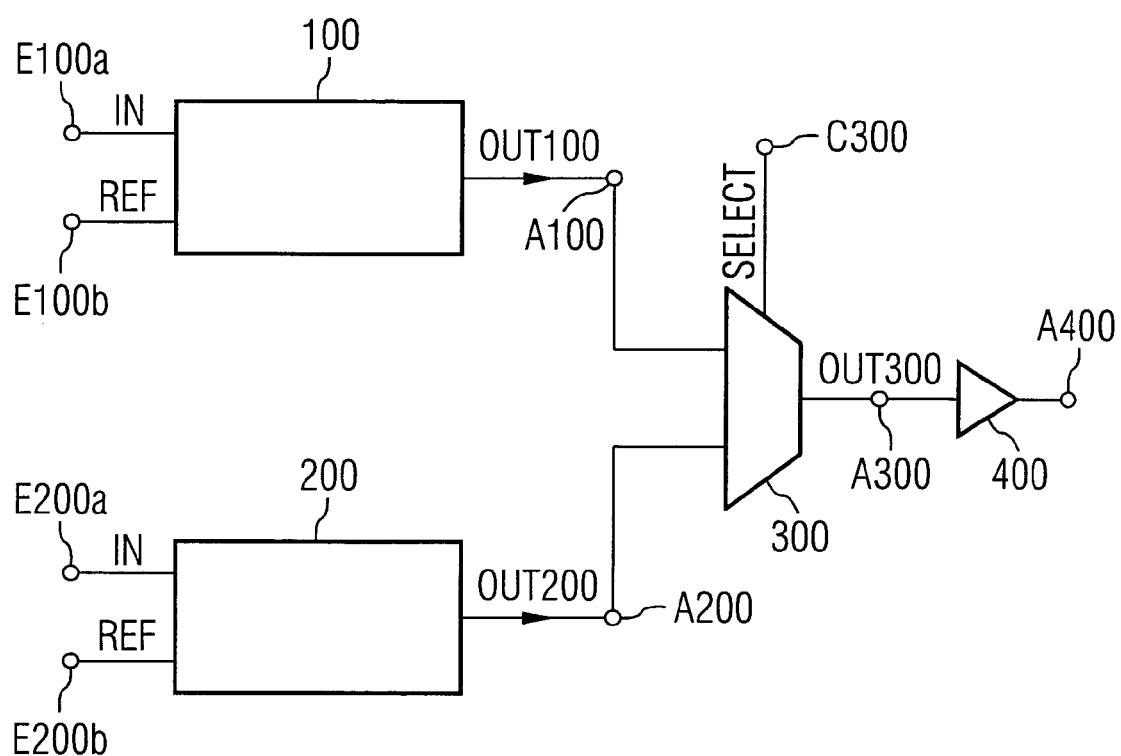
FIG. 9 shows an integrated receiver circuit comprising different embodiments of input receiver circuits according to the present invention.

FIG. 9 shows an integrated circuit comprising a first input receiver circuit 100 comprising an input terminal E100a for applying an input signal IN and an input terminal E100b for applying a reference signal REF. The input receiver circuit 100 comprises one of the embodiments of integrated receiver circuits shown in FIGS. 5 to 7. Furthermore, the integrated receiver circuit comprises an input receiver circuit 200 with an input terminal E200a for applying the input signal IN and an input terminal E200b for applying the reference signal REF. Input receiver circuit 200 is designed as an integrated receiver circuit according to FIG. 8. An output A100 for generating an amplified output signal OUT1 of input receiver circuit 100 and an output terminal A20 for generating an amplified output signal OUT2 of input receiver circuit 200 can be connected to an output terminal A30 by means of a select circuit 300. The select circuit 300 is controlled by a control signal SELECT applied to a control terminal C300. Output terminal A30 is connected to output terminal A400 by means of an amplifier circuit 400.

Figure 3:
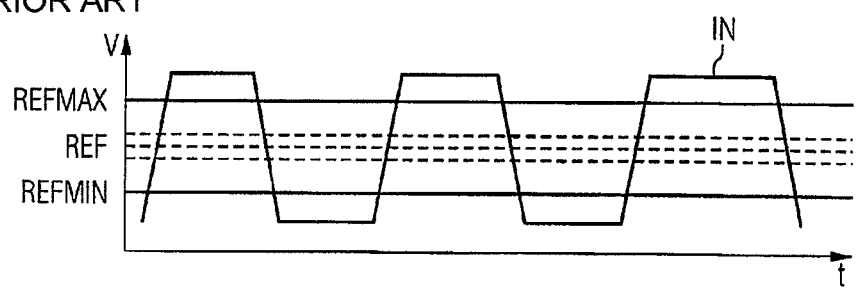
FIG. 3 shows an input signal asymmetrically oscillating around a reference signal, the reference signal having a large variation range.

In dependence on a level of the select signal SELECT, either output terminal A100 is connected to output terminal A30 or output terminal A20 is connected to output terminal A30. Input receiver circuit 100 is preferably connected to output terminal A30 if input signal IN and reference signal REF have a large level variation, as shown in FIG. 2. Input receiver circuit 200 is preferably used for generating an amplified output signal at output terminal A30 if the input signal IN asymmetrically oscillates around the level of the reference signal REF, as illustrated in FIG. 3.

Figure 4:
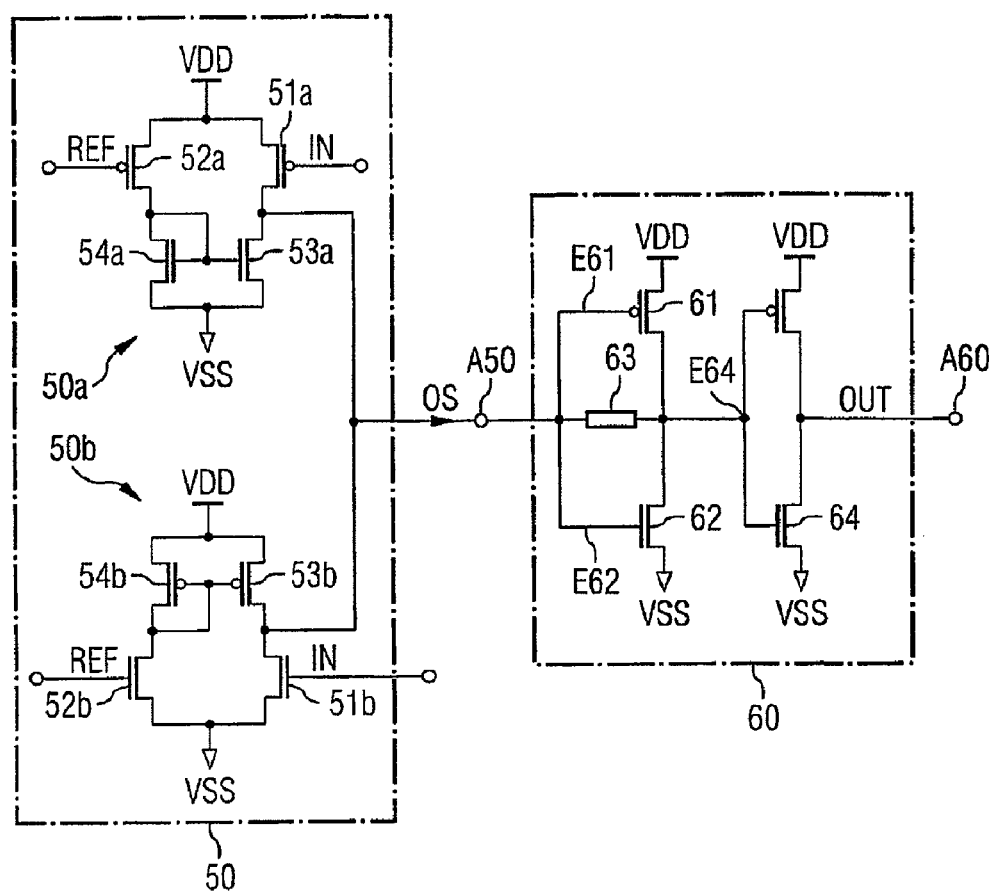
FIG. 4 shows an integrated receiver circuit according to another conventional design.
Figure 10:
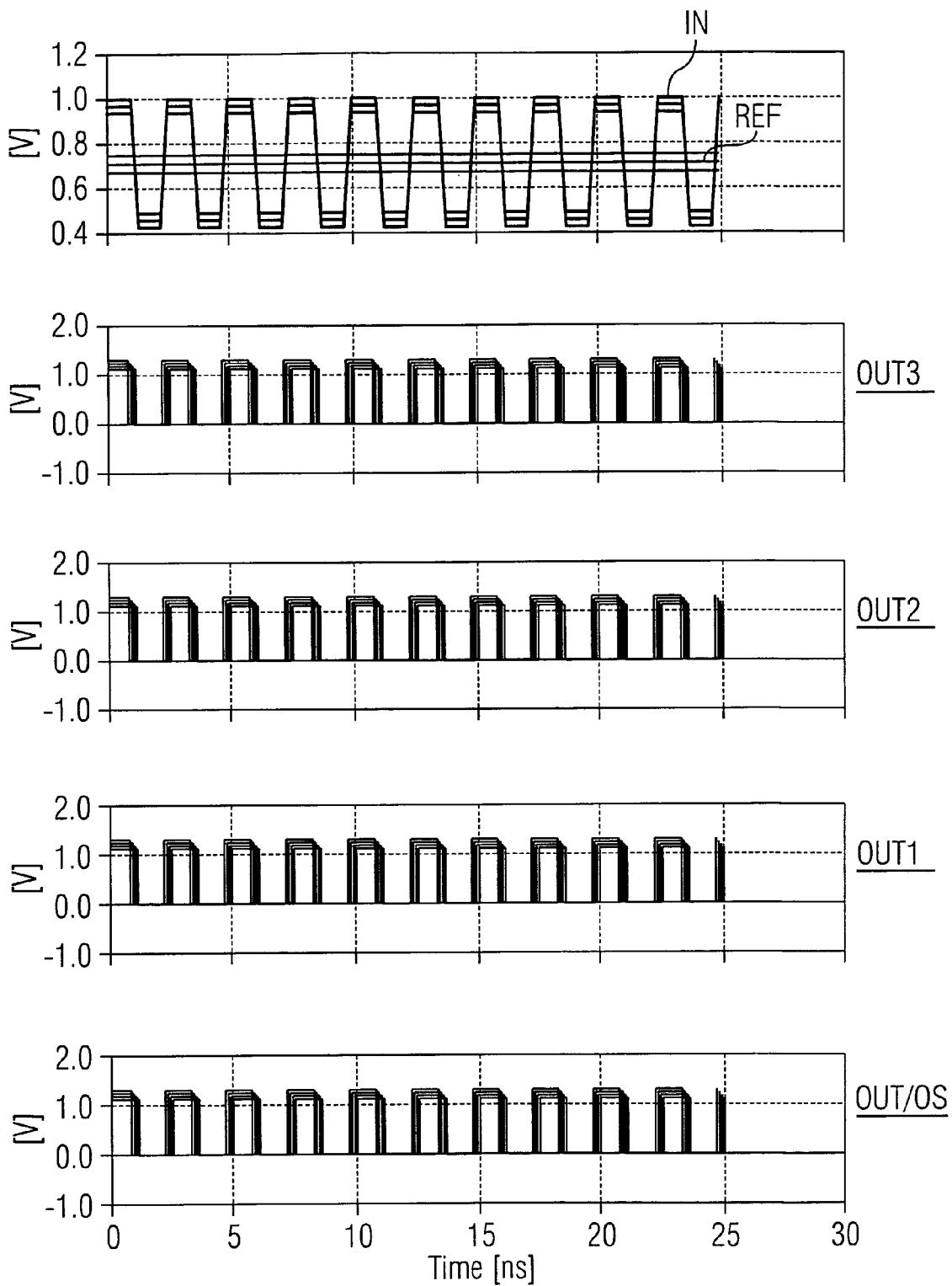
FIG. 10 shows first simulation results of input and output signals generated by integrated receiver circuits.

FIG. 10 shows, in the first diagram, three input signals IN oscillating around three different levels of a reference signal REF. If a conventional circuit, as shown in FIG. 1 or FIG. 4, is used which is designed for a low level of a reference signal REF, its amplified output signal does not need a duty cycle correction, because, as shown in the fifth diagram of FIG. 10, a high level of amplified output signal OUT/OS has the same duration as a low level of amplified signal OUT/OS. The further diagrams of FIG. 10 show the amplified output signals OUT1, OUT2 and OUT3 generated by the integrated circuits according to FIG. 6, FIG. 7 and FIG. 8. These circuit designs also generate amplified output signals OUT1, OUT2 and OUT3, wherein the high level has the same duration as the low level.

Figure 11:
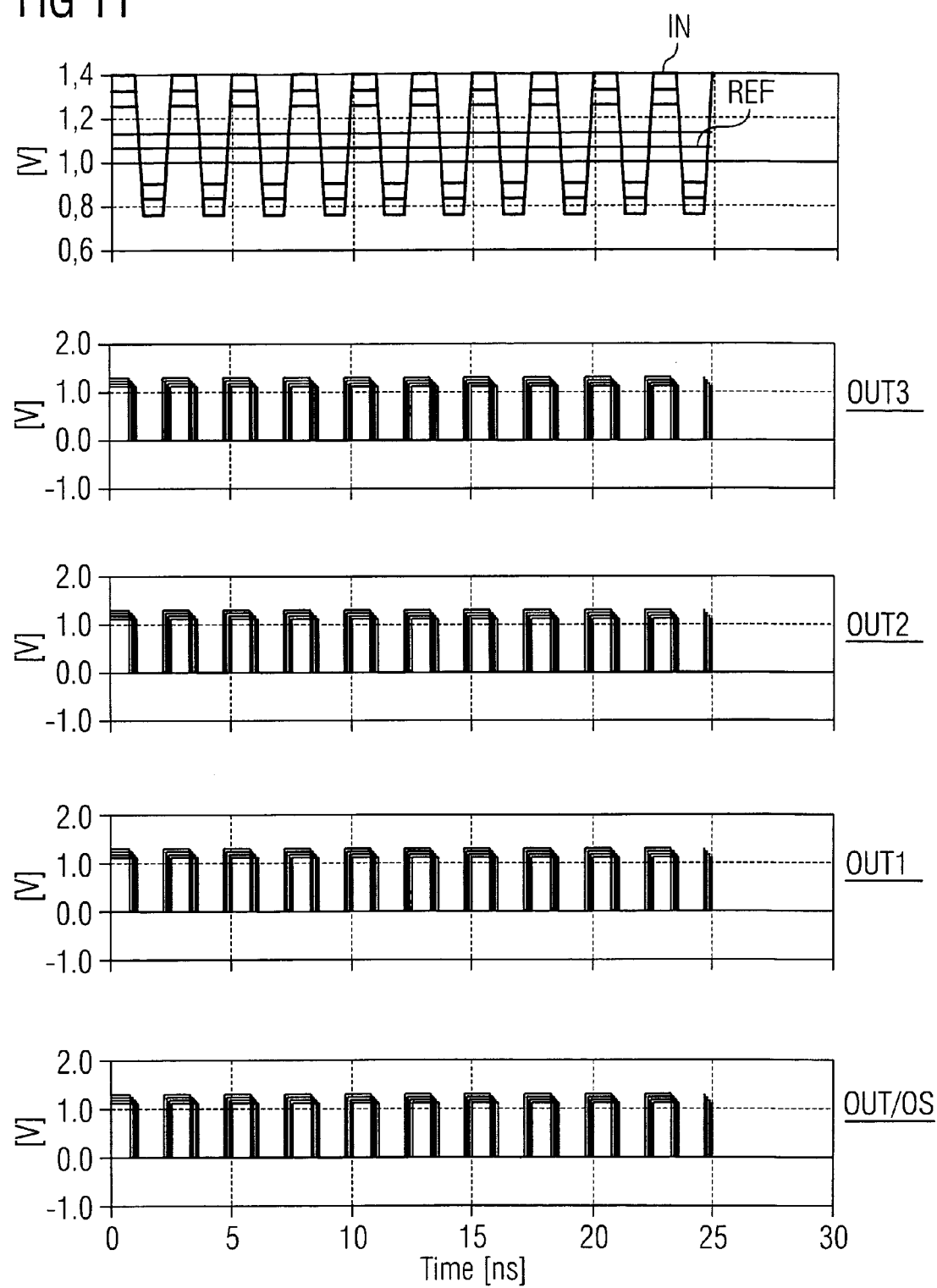
FIG. 11 shows second simulation results of input and output signals generated by integrated receiver circuits.

FIG. 11 shows three different input signals IN oscillating around three different levels of a reference signal REF. The levels of each of the reference signals are higher than the levels of each of the reference signals of FIG. 10. The fifth diagram shows the amplified output signal OUT/OS generated by an integrated receiver circuit according to a conventional design of FIG. 1 or FIG. 4. The conventional integrated receiver circuit is designed for a low level of reference signal REF. As illustrated in FIG. 11, amplified output signal OUT/OS shows a duty cycle distortion, because the low level of amplified output signal OUT/OS has a shorter duration than the high level. In contrast, amplified output signals OUT1, OUT2 and OUT3 generated by the integrated receiver circuits illustrated in FIGS. 6, 7 and 8 do not show any duty cycle distortion. The high levels of their amplified output signal have the same duration as their low levels.

Figure 12:
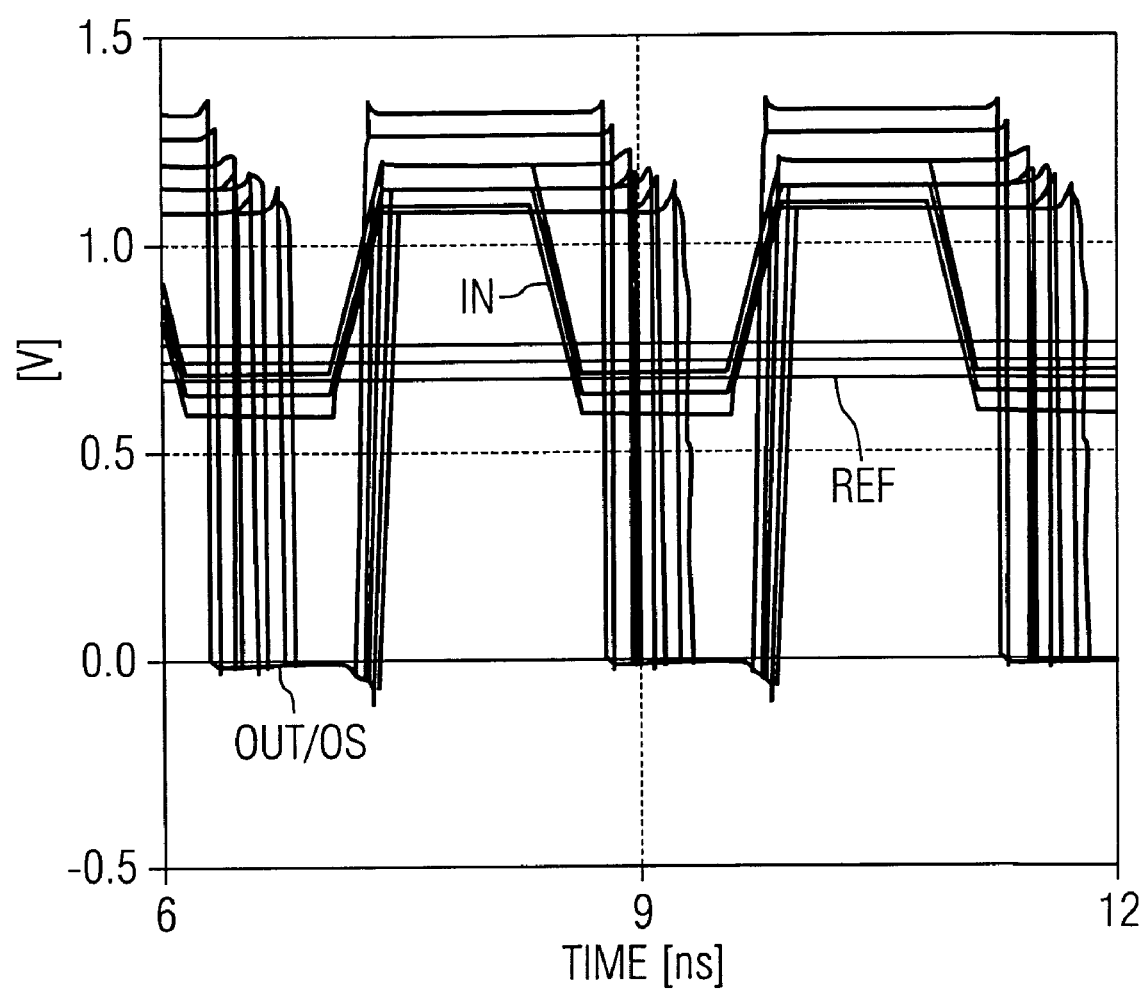
FIG. 12 shows first simulation results of input and output signals generated by a conventional integrated receiver circuit.
Figure 13:
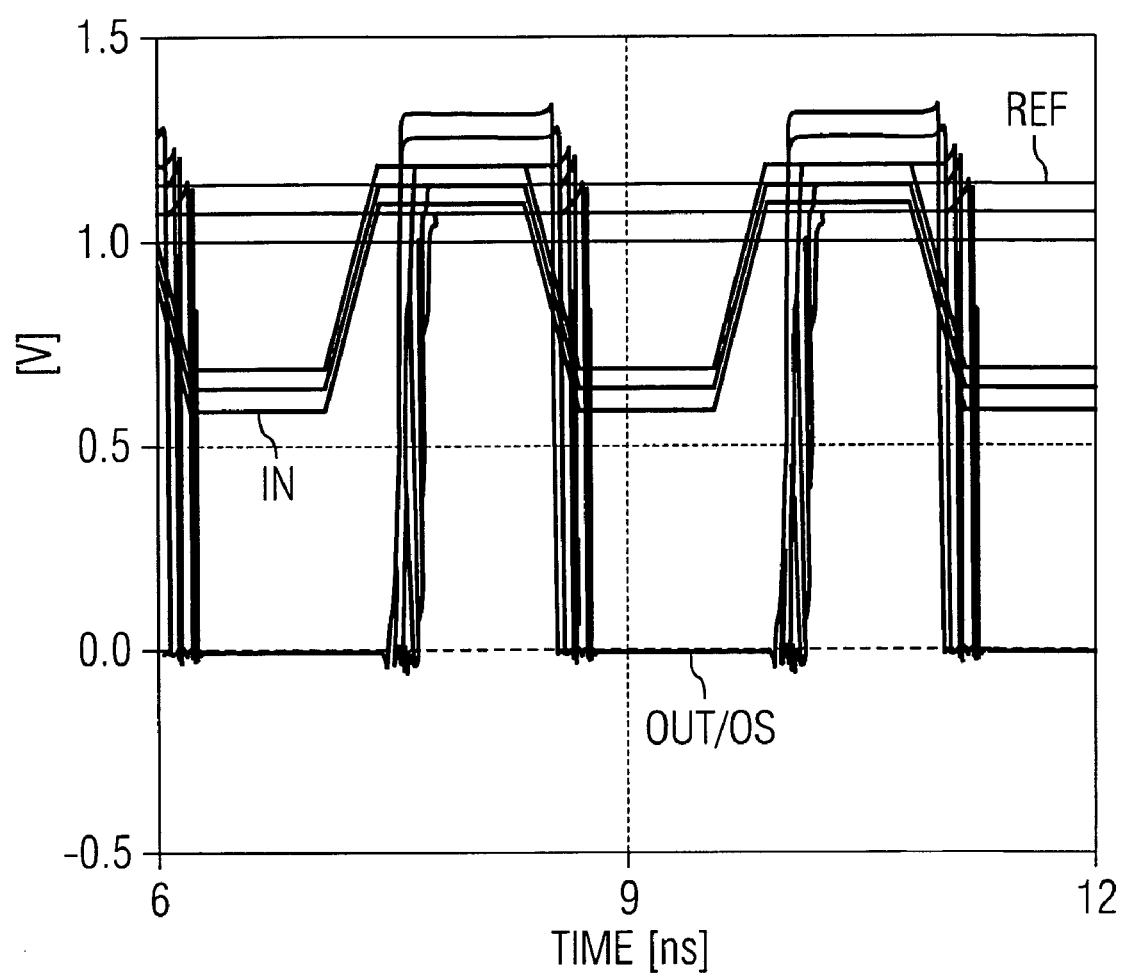
FIG. 13 shows second simulation results of input and output signals generated by a conventional integrated receiver circuit.

FIGS. 12 and 13 show a diagram of an amplified output signal OUT generated by an integrated receiver circuit according to a conventional design as shown in FIG. 1 or FIG. 4. FIG. 12 shows the amplified output signal OUT having a duty cycle distortion such that a high level of the amplified output signal has a longer duration than a short level of the amplified output signal if input signal IN asymmetrically oscillates around a low level of the reference signal REF. As shown in FIG. 13, the conventional integrated receiver circuit generates an amplified output signal OUT with a duty cycle distortion having a longer duration for a low level than for a high level if input signal IN asymmetrically oscillates around a high level of the reference signal REF.

Figure 14:
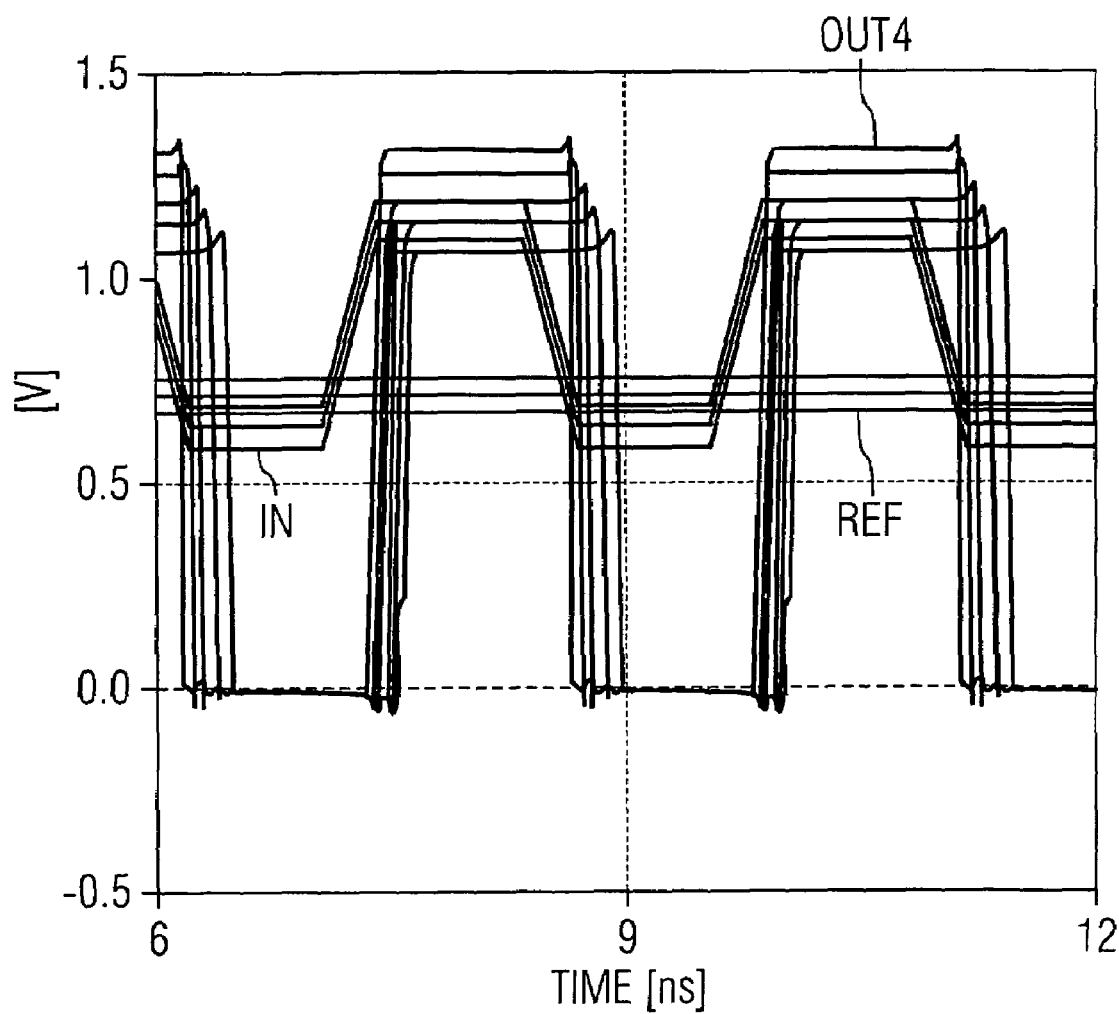
FIG. 14 shows first simulation results of input and output signals generated by an integrated receiver circuit according to the present invention.
Figure 15:
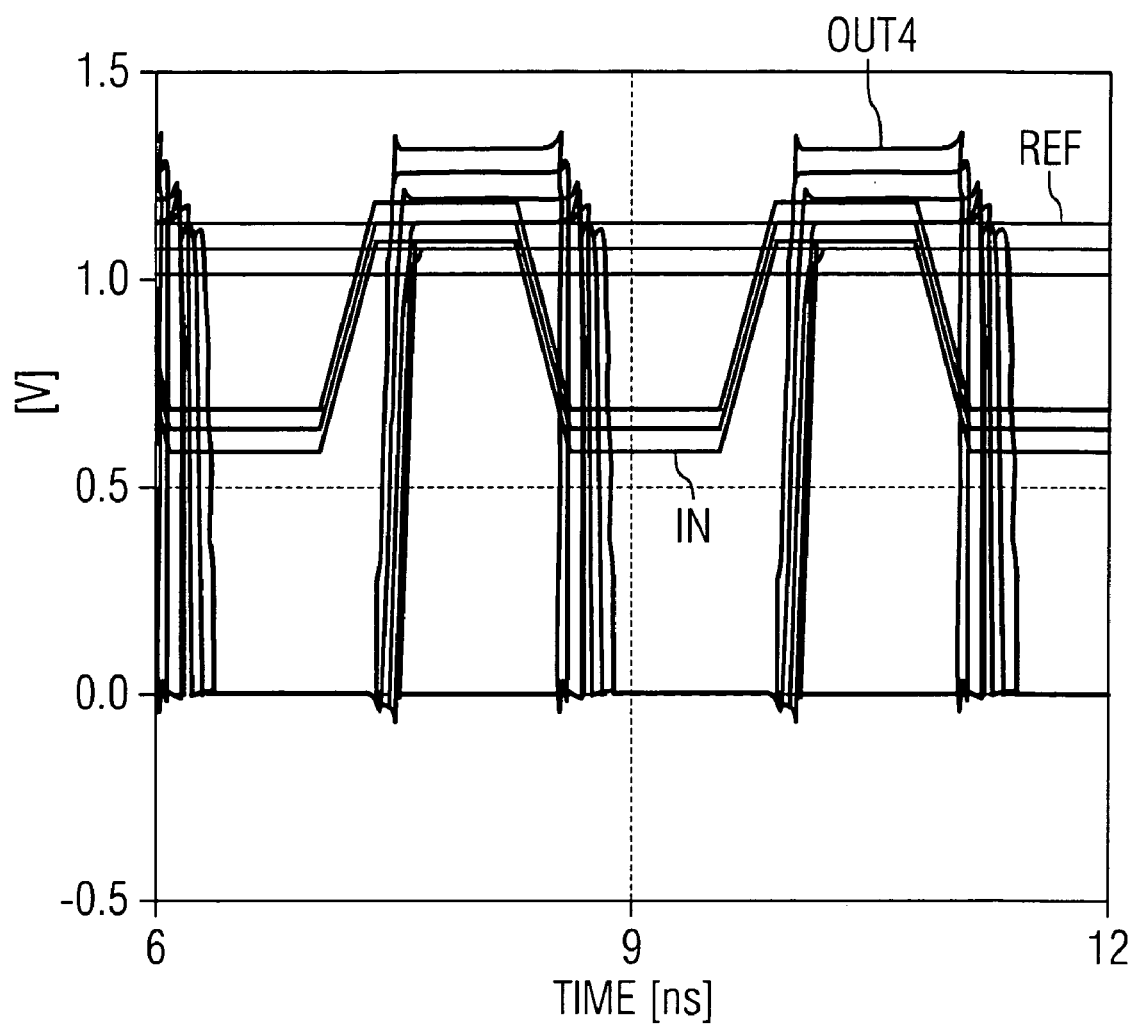
FIG. 15 shows second simulation results of input and output signals generated by an integrated receiver circuit according to the present invention.

FIGS. 14 and 15 show amplified output signals OUT4 generated by the integrated circuit shown in FIG. 8. In FIG. 14, the input signal IN has an asymmetrical swing around a low level of the reference signal REF. In FIG. 15, the input signal IN has an asymmetrical swing around a high level of the reference signal REF. In both cases, no duty cycle distortion will occur. High levels of the amplified output signal OUT4 are generated with the same duration as low levels of the amplified output signal.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of Reference Symbols | |
|---|---|
| 10 | First voltage Converter |
| 11, 12 | Transistor |
| 20 | Second voltage converter |
| 30 | Third voltage converter |
| 31, 32 | Transistor |
| 40 | Fourth voltage converter |
| 41, 42 | Transistor |
| 50 | Amplifier stage |
| 50a | NMOS input differential amplifier circuit |
| 50b | PMOS input differential amplifier circuit |
| 51-54 | Transistor |
| 60 | First control stage |
| 61-63 | Transistor |
| 70 | Second control stage |
| 71-73 | Transistor |
| 80 | Amplifier |
| 100 | First input receiver circuit |
| 200 | Second input receiver circuit |
| 210 | Voltage converter stage |
| 210a | First voltage converter circuit |
| 210b | Second voltage converter circuit |
| 211-214 | Transistor |
| 220 | Amplifier stage |
| 221, 222 | Transistor |
| 230 | First control stage |
| 231, 232 | Transistor |
| 233 | Resistor |
| 234 | Inverter |
| 240 | Second control stage |
| 241-243 | Transistor |
| 250 | Inverter |
| 300 | Select circuit |
| 400 | Amplifier |
| A | Output terminal |
| E | Input terminal |
| IN | Input signal |
| INP | First converted input signal |
| INN | Second converted input signal |
| OUT | Amplified output signal |
| REF | Reference signal |
| REFN | Second converted reference signal |
| REFP | First converted reference signal |
| VDD | Supply voltage |
| VSS | Reference voltage |

What is claimed is:

1. An integrated receiver circuit, comprising:
a first voltage converter including: a first input terminal for receiving an input signal; an output terminal for supplying a first converted input signal; and a source follower circuit that generates the first converted input signal with a level that is lower than a level of the input signal;
a second voltage converter including: a first input terminal for receiving a reference signal, wherein the input signal oscillates about the reference signal; an output terminal for supplying a first converted reference signal; and a source follower circuit that generates the first converted reference signal with a level that is lower than a level of the reference signal; and
an amplifier stage including: an output terminal for supplying an amplified signal having a level that depends on the level of the input signal with reference to the reference signal; a first differential amplifier circuit including a first input terminal for receiving the first converted input signal and a second input terminal for receiving the first converted reference signal; and a second differential amplifier circuit including a first input terminal for receiving the input signal and a second input terminal for receiving the reference signal; and a control stage comprising: an output terminal; a first transistor with a control terminal; a second transistor with a control terminal, the second transistor of the control stage being coupled to the output terminal of the control stage; and a third transistor with a control terminal, wherein: the first transistor of the control stage is coupled to the output terminal of the control stage; and wherein the control terminal of the third transistor of the control stage is actuated by one of the first converted reference signal and the reference signal.

2. The integrated receiver circuit of claim 1, wherein the first voltage converter further includes:
a second input terminal for receiving the reference signal;
a first transistor with a control terminal, the first transistor being coupled between a supply voltage and the output terminal of the first voltage converter; and
a second transistor with a control terminal, the second transistor being coupled between the output terminal of the first voltage converter and a reference voltage, wherein:
the first input terminal of the first voltage converter is connected to the control terminal of the first transistor of the first voltage converter; and
the second input terminal of the first voltage converter is connected to the control terminal of the second transistor of the first voltage converter.

3. The integrated receiver circuit of claim 2, wherein the second voltage converter further includes:
a second input terminal for receiving the reference signal;
a first transistor with a control terminal, the first transistor being coupled between a supply voltage and the output terminal of the second voltage converter; and
a second transistor with a control terminal, the second transistor being coupled between the output terminal of the second voltage converter and a reference voltage, wherein:
the first input terminal of the second voltage converter is connected to the control terminal of the first transistor of the second voltage converter; and
the second input terminal of the second voltage converter is connected to the control terminal of the second transistor of the second voltage converter.

4. The integrated receiver circuit of claim 3, wherein each of the first and second transistors of the first and second voltage converters is an n-type transistor.

5. The integrated receiver circuit of claim 1, wherein:
the first differential amplifier circuit further includes a first p-type transistor including a control terminal and a second p-type transistor including a control terminal;
the output terminal of the first voltage converter is connected to the control terminal of the first p-type transistor of the first differential amplifier circuit; and
the output terminal of the second voltage converter is connected to the control terminal of the second p-type transistor of the first differential amplifier circuit.

6. The integrated receiver circuit of claim 5, wherein:
the second differential amplifier circuit further includes a first n-type transistor including a control terminal and a second n-type transistor including a control terminal;
the control terminal of the first n-type transistor of the second differential amplifier circuit is driven with the input signal; and
the control terminal of the second n-type transistor of the second differential amplifier circuit is driven with the reference signal.

7. The integrated receiver circuit of claim 6, wherein:
the first differential amplifier circuit further includes an output terminal connected to the output terminal of the amplifier stage; and
the second differential amplifier circuit further includes an output terminal connected to the output terminal of the amplifier stage.

8. The integrated receiver circuit of claim 1, further comprising a further control stage comprising:
an output terminal;
a first transistor with a control terminal, the first transistor being coupled between a supply voltage and the output terminal of the further control stage, wherein the control terminal of the first transistor is connected to the output terminal of the amplifier stage;
a second transistor with a control terminal, the second transistor being coupled between the output terminal of the further control stage and a reference voltage, wherein the control terminal of the second transistor is connected to the output terminal of the amplifier stage; and
a resistor coupled between the output terminal of the amplifier stage and the output terminal of the further control stage.

9. The integrated receiver circuit of claim 8, wherein:
the first transistor of the further control stage is a p-type transistor; and
the second transistor of the further control stage is an n-type transistor.

10. The integrated receiver circuit of claim 8, wherein:
the second transistor of the control stage is coupled between the output terminal of the control stage and a reference voltage, wherein the control terminal of the second transistor is connected to the output terminal of the further control stage;
the first transistor of the control stage is coupled between the third transistor of the control stage and the output terminal of the control stage, wherein the control terminal of the first transistor is connected to the output terminal of the further control stage; and
the third transistor of the control stage is coupled between a supply voltage and the first transistor of the control stage.

11. The integrated receiver circuit of claim 10, wherein:
the first and third transistors of the control stage are p-type transistors; and
the second transistor of the control stage is an n-type transistor.

12. The integrated receiver circuit of claim 8, wherein:
the first transistor of the control stage is coupled between a supply voltage and the output terminal of the control stage, the control terminal of the first transistor being connected to the output terminal of the further control stage;
the second transistor of the control stage is coupled between the output terminal of the control stage and the third transistor, the control terminal of the second transistor being connected to the output terminal of the further control stage; and
the third transistor of the control stage is coupled between a reference voltage and the second transistor of the control stage, the control terminal of the third transistor being actuated by the reference signal.

13. The integrated receiver circuit of claim 12, wherein:
the first transistor of the control stage is a p-type transistor; and
the second and third transistors of the control stage are n-type transistors.

14. An integrated receiver circuit, comprising:
a first voltage converter including: a first input terminal for receiving an input signal; an output terminal for supplying a first converted input signal; and a source follower circuit that generates the first converted input signal with a level that is lower than a level of the input signal;
a second voltage converter including: a first input terminal for receiving a reference signal, wherein the input signal oscillates about the reference signal; an output terminal for supplying a first converted reference signal; and a source follower circuit that generates the first converted reference signal with a level that is lower than a level of the reference signal;
a third voltage converter including: a first input terminal for receiving the first converted input signal; an output terminal for supplying a second converted input signal; and a source follower circuit that generates the second converted input signal with a level that is higher than a level of the input signal;
a fourth voltage converter including: a first input terminal for receiving the first converted reference signal; an output terminal for supplying a second converted reference signal; and a source follower circuit that generates the second converted reference signal with a level that is higher than a level of the input signal; and
an amplifier stage including: an output terminal for supplying an amplified signal having a level that depends on the level of the input signal with reference to the reference signal; a first differential amplifier circuit including a first input terminal for receiving the first converted input signal and a second input terminal for receiving the first converted reference signal; and a second differential amplifier circuit including a first input terminal for receiving the second converted input signal and a second input terminal for receiving the second converted reference signal; and
a control stage comprising: an output terminal; a first transistor with a control terminal; a second transistor with a control terminal, the second transistor of the control stage being coupled to the output terminal of the control stage; and a third transistor with a control terminal, wherein: the first transistor of the control stage is coupled to the output terminal of the control stage; and wherein the control terminal of the third transistor of the control stage is actuated by one of the first converted reference signal and the reference signal.

15. The integrated receiver circuit of claim 14, wherein the first voltage converter further includes:
a second input terminal for receiving the reference signal;
a first transistor with a control terminal, the first transistor being coupled between a supply voltage and the output terminal of the first voltage converter; and
a second transistor with a control terminal, the second transistor being coupled between the output terminal of the first voltage converter and a reference voltage, wherein:
the first input terminal of the first voltage converter is connected to the control terminal of the first transistor of the first voltage converter; and the second input terminal of the first voltage converter is connected to the control terminal of the second transistor of the first voltage converter.

16. The integrated receiver circuit of claim 15, wherein the second voltage converter further includes:
a second input terminal for receiving the reference signal;
a first transistor with a control terminal, the first transistor being coupled between a supply voltage and the output terminal of the second voltage converter; and
a second transistor with a control terminal, the second transistor being coupled between the output terminal of the second voltage converter and a reference voltage, wherein:
the first input terminal of the second voltage converter is connected to the control terminal of the first transistor of the second voltage converter; and
the second input terminal of the second voltage converter is connected to the control terminal of the second transistor of the second voltage converter.

17. The integrated receiver circuit of claim 16, wherein each of the first and second transistors of the first and second voltage converters is an n-type transistor.

18. The integrated receiver circuit of claim 14, wherein the third voltage converter further includes:
a second input terminal for receiving the first converted reference signal;
a first transistor with a control terminal, the first transistor being coupled between a reference voltage and the output terminal of the third voltage converter; and
a second transistor with a control terminal (E32), the second transistor being coupled between the output terminal of the third voltage converter and a supply voltage, wherein:
the first input terminal of the third voltage converter is connected to the control terminal of the first transistor of the third voltage converter; and
the second input terminal of the third voltage converter is connected to the control terminal of the second transistor of the third voltage converter.

19. The integrated receiver circuit of claim 14, wherein the fourth voltage converter further includes:
a second input terminal for receiving the first converted reference signal;
a first transistor with a control terminal, the first transistor of the fourth voltage converter being coupled between a supply voltage and the output of the fourth voltage converter; and
a second transistor with a control terminal, the second transistor being coupled between the output terminal of the fourth voltage converter and a reference voltage, wherein:
the first input terminal of the fourth voltage converter is connected to the control terminal of the first transistor of the fourth voltage converter; and
the second input terminal of the fourth voltage converter is connected to the control terminal of the second transistor of the fourth voltage converter.

20. The integrated receiver circuit of claim 19, wherein each of the first and second transistors of the third and fourth voltage converters are p-type transistors.

21. The integrated receiver circuit of claim 14, wherein:
the first differential amplifier circuit further includes a first p-type transistor including a control terminal and a second p-type transistor including a control terminal;
the output terminal of the first voltage converter is connected to the control terminal of the first p-type transistor of the first differential amplifier circuit; and
the output terminal of the second voltage converter is connected to the control terminal of the second p-type transistor of the first differential amplifier circuit.

22. The integrated receiver circuit of claim 21, wherein:
the second differential amplifier circuit further includes a first n-type transistor including a control terminal and a second n-type transistor including a control terminal;
the control terminal of the first n-type transistor of the second differential amplifier circuit is driven with the input signal; and
the control terminal of the second n-type transistor of the second differential amplifier circuit is driven with the reference signal.

23. The integrated receiver circuit of claim 22, wherein:
the first differential amplifier circuit further includes an output terminal connected to the output terminal of the amplifier stage; and
the second differential amplifier circuit further includes an output terminal connected to the output terminal of the amplifier stage.

24. The integrated receiver circuit of claim 14, further comprising a further control stage comprising:
an output terminal;
a first transistor with a control terminal, the first transistor being coupled between a supply voltage and the output terminal of the further control stage, wherein the control terminal of the first transistor is connected to the output terminal of the amplifier stage;
a second transistor with a control terminal, the second transistor being coupled between the output terminal of the further control stage and a reference voltage, wherein the control terminal of the second transistor is connected to the output terminal of the amplifier stage; and
a resistor coupled between the output terminal of the amplifier stage and the output terminal of the further control stage.

25. The integrated receiver circuit of claim 24, wherein:
the first transistor of the further control stage is a p-type transistor; and
the second transistor of the further control stage is an n-type transistor.

26. The integrated receiver circuit of claim 24, wherein:
the second transistor of the control stage is coupled between the output terminal of the control stage and a reference voltage, wherein the control terminal of the second transistor is connected to the output terminal of the further control stage;
the first transistor of the control stage is coupled between the third transistor of the control stage and the output terminal of the control stage, wherein the control terminal of the first transistor is connected to the output terminal of the further control stage; and
the third transistor of the control stage is coupled between a supply voltage and the first transistor of the control stage.

27. The integrated receiver circuit of claim 26, wherein:
the first and third transistors of the control stage are p-type transistors; and
the second transistor of the control stage is an n-type transistor.

28. The integrated receiver circuit of claim 24, wherein:
the first transistor of the control stage is coupled between a supply voltage and the output terminal of the control stage, the control terminal of the first transistor being connected to the output terminal of the further control stage; and the second transistor of the control stage is coupled between the output terminal of the control stage and the third transistor, the control terminal of the second transistor being connected to the output terminal of the further control stage, the third transistor of the control stage being coupled between a reference voltage and the second transistor of the control stage.

29. The integrated receiver circuit of claim 28, wherein:
the first transistor of the control stage is a p-type transistor; and
the second and third transistors of the control stage are n-type transistors.

30. Integrated receiver circuit, comprising:
a voltage converter stage comprising: an output terminal; a first voltage converter including a first input terminal for receiving a reference signal and an output terminal, the first voltage converter supplying a first converted reference signal at its output terminal with a level that is lower than a level of the reference signal; and a second voltage converter including a first input terminal for receiving the first converted reference signal, the second voltage converter generating a second converted reference signal at the output terminal of the voltage converter stage; and
a differential amplifier circuit comprising: a first input terminal for receiving an input signal, wherein the input signal oscillates around the reference signal and a high level of the input signal is above a level of the reference signal and a low level of the input signal is below the level of the reference signal; a second input terminal for receiving the second converted reference signal, wherein the level of the second converted reference signal is between the high and the low level of the input signal; and an output terminal for supplying an amplified signal, wherein the amplified signal has a level depending on a level of the input signal with reference to the second converted reference signal.

31. The integrated receiver circuit of claim 30, wherein:
the first voltage converter funher includes a second input terminal for receiving the reference signal; a first transistor coupled between a supply voltage and the output terminal of the first voltage converter; and a second transistor coupled between the output terminal of the first voltage converter and a reference voltage;
the second voltage converter funher includes: a first transistor coupled between a supply voltage and the output terminal of the voltage converter stage; and a second transistor coupled between the output terminal of the voltage converter stage and a reference voltage, each of the first and second transistors of the second voltage converter being actuated by the first converted reference signal.

32. The integrated receiver circuit of claim 31, wherein:
the first and second transistors of the first voltage converter are n-type transistors; and
the first and second transistors of the second voltage converter are p-type transistors.

33. The integrated receiver circuit of claim 30, further comprising a first control stage comprising:
an output terminal;
an inverter with an input terminal and an output terminal connected to the output terminal of the first control stage;
a first transistor coupled between a supply voltage and the input terminal of the inverter, the first transistor including a control terminal connected to the output terminal of the differential amplifier circuit;
a second transistor coupled between the input terminal of the inverter and a reference voltage, the second transistor including a control terminal; and
a resistor coupled between the output terminal of the differential amplifier circuit and the input terminal of the inverter.

34. Integrated receiver circuit of claim 30, further comprising a second control stage comprising:
an output terminal;
a first transistor coupled between a third transistor of the second control stage and the output terminal of the second control stage, the first transistor including a control terminal connected to the output terminal of the first control stage;
a second transistor coupled between the output terminal of the second control stage and a reference voltage, the second transistor including a control terminal connected to the output terminal of the first control stage; and
the third transistor coupled between a supply voltage and the first transistor of the second control stage, the third transistor including a control terminal actuated by the first converted reference signal.

35. The integrated receiver circuit of claim 34, wherein:
the first and third transistors of the second control stage are p-type transistors; and
the second transistor of the second control stage is an n-type transistor.

36. An integrated receiver circuit, comprising:
an output terminal for supplying an amplified signal;
a first input receiver circuit comprising:
a first voltage converter including: a first input terminal for receiving an input signal; an output terminal for supplying a first converted input signal; and a source follower circuit that generates the first converted input signal with a level that is lower than a level of the input signal;
a second voltage converter including: a first input terminal for receiving a reference signal, wherein the input signal oscillates about the reference signal; an output terminal for supplying a first converted reference signal; and a source follower circuit that generates the first converted reference signal with a level that is lower than a level of the reference signal; and
an amplifier stage including: an output terminal for supplying an amplified signal having a level that depends on the level of the input signal with reference to the reference signal; a first differential amplifier circuit including a first input terminal for receiving the first converted input signal and a second input terminal for receiving the first converted reference signal; and a second differential amplifier circuit including a first input terminal for receiving the input signal and a second input terminal for receiving the reference signal;
a second input receiver circuit, comprising:
a voltage converter stage comprising: an output terminal; a first voltage converter including a first input terminal for receiving a reference signal and an output terminal, the first voltage converter supplying a first converted reference signal at its output terminal with a level that is lower than a level of the reference signal; and a second voltage converter including a first input terminal for receiving the first converted reference signal, the second voltage converter generating a second converted reference signal at the output terminal of the voltage converter stage; and a differential amplifier circuit comprising: a first input terminal for receiving an input signal, wherein the input signal oscillates around the reference signal and a high level of the input signal is above a level of the reference signal and a low level of the input signal is below the level of the reference signal; a second input terminal for receiving the second converted reference signal, wherein the level of the second converted reference signal is between the high and the low level of the input signal; and an output terminal for supplying an amplified signal, wherein the amplified signal has a level depending on a level of the input signal with reference to the second converted reference signal; and a select circuit comprising a control terminal for applying a select signal and an output terminal, an output terminal of the first input receiver circuit being connected to the output terminal of the select circuit when the select signal has a first level, and an output terminal of the second input receiver circuit being connected to the output terminal of the select circuit when the select signal has a second level.

37. An integrated receiver circuit, comprising:

an output terminal for supplying an amplified signal;

a first input receiver circuit comprising:

a first voltage converter including: a first input terminal for receiving an input signal; an output terminal for supplying a first converted input signal; and a source follower circuit that generates the first converted input signal with a level that is lower than a level of the input signal;

a second voltage converter including: a first input terminal for receiving a reference signal, wherein the input signal oscillates about the reference signal; an output terminal for supplying a first converted reference signal; and a source follower circuit that generates the first converted reference signal with a level that is lower than a level of the reference signal;

a third voltage converter including: a first input terminal for receiving the first converted input signal; an output terminal for supplying a second converted input signal; and a source follower circuit that generates the second converted input signal with a level that is higher than a level of the input signal;

a fourth voltage converter including: a first input terminal for receiving the first converted reference signal; an output terminal for supplying a second converted reference signal; and a source follower circuit that generates the second converted reference signal with a level that is higher than a level of the input signal; and an amplifier stage including: an output terminal for supplying an amplified signal having a level that depends on the level of the input signal with reference to the reference signal; a first differential amplifier circuit including a first input terminal for receiving the first converted input signal and a second input terminal for receiving the first converted reference signal; and a second differential amplifier circuit including a first input terminal for receiving the second converted input signal and a second input terminal for receiving the second converted reference signal;

a second input receiver circuit, comprising:

a voltage converter stage comprising: an output terminal; a first voltage converter including a first input terminal for receiving a reference signal and an output terminal, the first voltage converter supplying a first converted reference signal at its output terminal with a level that is lower than a level of the reference signal; and a second voltage converter including a first input terminal for receiving the first converted reference signal, the second voltage converter generating a second converted reference signal at the output terminal of the voltage converter stage; and a differential amplifier circuit comprising: a first input terminal for receiving an input signal, wherein the input signal oscillates around the reference signal and a high level of the input signal is above a level of the reference signal and a low level of the input signal is below the level of the reference signal; a second input terminal for receiving the second converted reference signal, wherein the level of the second converted reference signal is between the high and the low level of the input signal; and an output terminal for supplying an amplified signal, wherein the amplified signal has a level depending on a level of the input signal with reference to the second converted reference signal; and a select circuit comprising a control terminal for applying a select signal and an output terminal, an output terminal of the first input receiver circuit being connected to the output terminal of the select circuit when the select signal has a first level, and an output terminal of the second input receiver circuit being connected to the output terminal of the select circuit when the select signal has a second level.

* * * * *

UNITED STATES PATENT AND TRADEMARK OFFICE
CERTIFICATE OF CORRECTION

| | | |
|---|---|---|
| PATENT NO. | : 7,368,948 B2 | Page 1 of 1 |
| APPLICATION NO. | : 11/182064 | |
| DATED | : May 6, 2008 | |
| INVENTOR(S) | : Hari Dubey | |

It is certified that error appears in the above-identified patent and that said Letters Patent is hereby corrected as shown below:

Column 13,   line 52: "OUT 1" should read -- OUT100 -- line 53: "A20" should read -- A200 -- line 54: "OUT2" should read -- OUT200 -- line 56: "A30" should read -- A300 -- line 58: "A30" should read -- A300 -- line 62: "A30 or output terminal A20" should read -- A300 or output terminal A200 -- line 63: "A30" should read -- A300 -- line 67: "A30" should read -- A300 --

Column 21,   line 39: "funher" should read -- further -- line 45: "funher" should read -- further --

Signed and Sealed this

Twenty-ninth Day of July, 2008

JON W. DUDAS
*Director of the United States Patent and Trademark Office*